United States Patent
Yamada et al.

(10) Patent No.: US 11,535,761 B2
(45) Date of Patent: Dec. 27, 2022

(54) QUANTUM DOT-CONTAINING COMPOSITION, WAVELENGTH CONVERSION MEMBER, BACKLIGHT UNIT, AND LIQUID CRYSTAL DISPLAY DEVICE

(71) Applicant: FUJIFILM Corporation, Tokyo (JP)

(72) Inventors: Naoyoshi Yamada, Kanagawa (JP); Ryo Satake, Kanagawa (JP); Natsuru Chikushi, Kanagawa (JP); Kyohei Arayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 983 days.

(21) Appl. No.: 16/248,098

(22) Filed: Jan. 15, 2019

(65) Prior Publication Data

US 2019/0144689 A1    May 16, 2019

Related U.S. Application Data

(63) Continuation of application No. PCT/JP2017/026302, filed on Jul. 20, 2017.

(30) Foreign Application Priority Data

Jul. 20, 2016   (JP) .............................. JP2016-142729

(51) Int. Cl.
   *C09K 11/02*    (2006.01)
   *C09K 11/08*    (2006.01)
   (Continued)

(52) U.S. Cl.
   CPC ................ *C09D 5/22* (2013.01); *B82Y 30/00* (2013.01); *C08F 220/1812* (2020.02);
   (Continued)

(58) Field of Classification Search
   CPC ........ C09K 11/025; C09K 11/02; C09K 11/08; C09K 11/88; C09K 11/883; C09K 11/56;
   (Continued)

(56) References Cited

U.S. PATENT DOCUMENTS

2004/0250745 A1    12/2004  Ogura et al.
2012/0113671 A1     5/2012  Sadasivan et al.
(Continued)

FOREIGN PATENT DOCUMENTS

CN    102177095 A    9/2011
CN    102879364 A    1/2013
(Continued)

OTHER PUBLICATIONS

Thiry et al., "Fluorescence Properties of Hydrophilic Semiconductor Nanoparticles with Tridentate Polyethylene Oxide Ligands", ACS Nano, vol. 5, No. 6, pp. 4965-4973. (Year: 2011).*
(Continued)

*Primary Examiner* — Matthew E. Hoban
*Assistant Examiner* — Lynne Edmondson
(74) *Attorney, Agent, or Firm* — Edwards Neils LLC; Jean C. Edwards, Esq.

(57) ABSTRACT

A quantum dot-containing composition includes a quantum dot, a ligand having coordinating groups, which coordinates to the surface of the quantum dots, and the ligand is represented by Formula I.

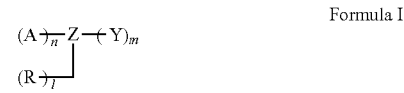

Formula I

In Formula I, A is an organic group including one or more coordinating groups selected from an amino group, a car-
(Continued)

boxy group, a mercapto group, a phosphine group, and a phosphine oxide group, Z is an (n+m+l)-valent organic linking group, R is a group including an alkyl group, an alkenyl group, or an alkynyl group each of which may have a substituent, Y is a group having a polymer chain which has a degree of polymerization of 3 or greater and which includes a polyacrylate skeleton or the like. n and m are each independently 1 or greater, l is 0 or greater, and n+m+l is integer 3 or greater. At least two coordinating groups are included in a molecule.

11 Claims, 3 Drawing Sheets

(51) Int. Cl.
| | |
|---|---|
| C09K 11/56 | (2006.01) |
| C09K 11/70 | (2006.01) |
| H01L 33/50 | (2010.01) |
| G02F 1/017 | (2006.01) |
| C09D 5/22 | (2006.01) |
| F21S 2/00 | (2016.01) |
| G02B 5/20 | (2006.01) |
| C09K 11/88 | (2006.01) |
| G02F 1/00 | (2006.01) |
| C08F 220/18 | (2006.01) |
| B82Y 30/00 | (2011.01) |
| C09D 133/08 | (2006.01) |
| C09D 133/10 | (2006.01) |
| F21V 8/00 | (2006.01) |

(52) U.S. Cl.
CPC ......... *C09D 133/08* (2013.01); *C09D 133/10* (2013.01); *C09K 11/02* (2013.01); *C09K 11/025* (2013.01); *C09K 11/08* (2013.01); *C09K 11/0811* (2013.01); *C09K 11/70* (2013.01); *C09K 11/88* (2013.01); *C09K 11/883* (2013.01); *F21S 2/00* (2013.01); *G02B 5/20* (2013.01); *G02F 1/00* (2013.01); *H01L 33/50* (2013.01); *G02B 6/005* (2013.01); *G02B 6/0055* (2013.01)

(58) Field of Classification Search
CPC ... C09K 11/0811; C09K 11/661; C09K 11/70; C09K 19/00; C09K 19/3405; C09K 2019/0448; C09K 2323/00; G02F 1/133614; G02F 1/01791; G02F 1/133621; G02F 1/133514; G02F 2202/022; G02F 2202/36; H01L 33/50; H01L 33/502; H01L 33/507; H01L 21/02601; C09D 133/08; C09D 133/10; C09D 5/22; B82Y 30/00; B82Y 20/00; C08F 220/1812; C08L 101/02; Y10T 428/249921; Y10T 428/268; Y10T 428/2998
USPC .......................................................... 349/71
See application file for complete search history.

(56) References Cited

U.S. PATENT DOCUMENTS

| | | |
|---|---|---|
| 2012/0267616 A1 | 10/2012 | Jang et al. |
| 2014/0056024 A1 | 2/2014 | Kim et al. |
| 2015/0192273 A1 | 7/2015 | Hikmet et al. |
| 2018/0079868 A1 | 3/2018 | Yamada et al. |

FOREIGN PATENT DOCUMENTS

| | | | |
|---|---|---|---|
| JP | 2002-121549 A | 4/2002 | |
| JP | 2004-300253 A | 10/2004 | |
| JP | 2007-273498 A | 10/2007 | |
| JP | 2011-514879 A | 5/2011 | |
| JP | 2012-525467 A | 10/2012 | |
| JP | 2013-539598 A | 10/2013 | |
| JP | 2014-040572 A | 3/2014 | |
| JP | 2014-108986 A | 6/2014 | |
| JP | 2015-530606 A | 10/2015 | |
| JP | 2016-066041 A | 4/2016 | |
| WO | WO-2015138174 A1 * | 9/2015 | ........... C08G 77/392 |
| WO | 2016/189869 A1 | 12/2016 | |
| WO | 2017/150297 A1 | 9/2017 | |

OTHER PUBLICATIONS

Office Action, issued by the Korean Intellectual Property Office dated May 13, 2020, in connection with Korean Patent Application No. 10-2019-7001332.
International Search Report issued in PCT/JP2017/026302 dated Oct. 3, 2017.
Written Opinion issued in PCT/JP2017/026302 dated Oct. 3, 2017.
International Preliminary Report on Patentability completed by WIPO dated Jan. 22, 2019 in connection with International Patent Application No. PCT/JP2017/026302.
Gravel, E. et al., Compact tridentate ligands for enhanced aqueous stability of quantum dots and in vivo imaging, Chemical Science, (2013), 4(1), 411-417.
Office Action, issued by the Japanese Patent Office dated Aug. 27, 2019, in connection with Japanese Patent Application No. 2018-528864.
Office Action, issued by the State Intellectual Property Office dated Apr. 1, 2021, in connection with Chinese Patent Application No. 201780044078.5.

* cited by examiner

QUANTUM DOT-CONTAINING COMPOSITION, WAVELENGTH CONVERSION MEMBER, BACKLIGHT UNIT, AND LIQUID CRYSTAL DISPLAY DEVICE

CROSS-REFERENCE TO RELATED APPLICATIONS

This application is a continuation application of International Application No. PCT/JP2017/026302, filed Jul. 20, 2017, which was published under PCT Article 21(2) in Japanese, and which claims priority from Japanese Patent Application No. 2016-142729, filed Jul. 20, 2016. The above applications are hereby expressly incorporated by reference, in their entirety, into the present specification.

BACKGROUND OF THE INVENTION

1. Field of the Invention

The present disclosure relates to a quantum dot-containing composition, a wavelength conversion member, a backlight unit, and a liquid crystal display device.

2. Description of the Related Art

A flat panel display such as a liquid crystal display device (simply referred to as "LCD") is increasingly used as an image display device with low power consumption and space saving year by year. The liquid crystal display device includes at least a backlight and a liquid crystal cell and typically further includes members such as a backlight side polarizing plate and a viewing side polarizing plate.

Recently, for the purpose of improving the color reproducibility of the LCD, a configuration including a wavelength conversion layer including quantum dots (also called QD) as a light emitting material in a wavelength conversion member of a backlight unit has attracted attention. The wavelength conversion member is a member that converts a wavelength of light incident from the light source and emits white light, and in a case where the wavelength conversion layer includes quantum dots as a light emitting material, the wavelength conversion layer can form white light using fluorescence emitted from two or three kinds of quantum dots excited by the light incident from the light source and having different emission characteristics.

Since the fluorescence due to the quantum dots has high brightness and small half-width, the LCD including quantum dots has excellent color reproducibility. With the progress of three-wavelength light source technology using such quantum dots, the color reproduction range has increased from 72% to 100% of the National Television System Committee (NTSC) ratio.

Typically, a ligand is coordinated on the surfaces of the quantum dots for the purpose of improving the affinity of a solvent in the composition with quantum dots or the light emission efficiency. A ligand may be contained in the composition including quantum dots in some cases. For example, in JP2012-525467A, a composition including quantum dots and a polymer ligand is disclosed. The polymer ligand has a silicone skeleton and one or more amino groups and amino moieties linked to the silicone skeleton.

JP2011-514879A discloses nanoparticles having a ligand bonded to surfaces thereof. This ligand is represented by a formula of X-Sp-Z, X is selected from a primary amine group, a secondary amine group, urea, and the like, Sp is a spacer group through which charges can be transferred, and Z is a reactive group that provides specific chemical reactivity to nanoparticles. As the reactive group, a thiol group, a carboxyl group, and the like are disclosed.

SUMMARY OF THE INVENTION

As described above, as the color reproducibility of LCD improves, sophisticated level of characteristics and long term reliability has been demanded for the wavelength conversion member used for a display device. However, in a case of a display device in which a wavelength conversion member including quantum dots is used, the light emission efficiency of the quantum dot may gradually decrease due to storage in a high temperature environment or temperature rise of the main body while the display device is on, resulting in a decreases in brightness.

The wavelength conversion member using quantum dots is typically provided as a wavelength conversion film including a wavelength conversion layer containing quantum dots and is incorporated in a backlight unit of a liquid crystal display device. However, as liquid crystal display devices, including display devices for smartphones, have got thinner and thinner in recent years, a wavelength conversion film in a thinner scale has been desired. In order to meet the demand on the wavelength conversion film in a thinner scale, the concentration of the quantum dots included in the wavelength conversion layer needs to be increased so as to decrease the thickness of the wavelength conversion layer. Although acrylate resins, which are favorable from the viewpoint of productivity, are desirable for binder resin in the wavelength conversion layer, it has been difficult to disperse the quantum dots into the acrylate resin in high concentration, and the thickness of the wavelength conversion layer could not be decreased.

In view of the above, the present disclosure provides a quantum dot-containing composition that suppresses a decrease in brightness due to heat and allows quantum dots to be dispersed into an acrylate resin in high concentration, and thus allows a wavelength conversion layer to be obtained in a thinner scale.

The present disclosure also provides a wavelength conversion member, a backlight unit, and a liquid crystal display device, which can be obtained in a thinner scale with a suppressed decrease in brightness due to heat.

The present inventors have assumed that the decrease in the brightness of the quantum dots due to heat is caused by detachment of ligands covering surfaces of quantum dots from the surfaces of the quantum dots due to heat. In a case where a ligand is detached from a quantum dot surface, a surface level is generated on where the ligand is detached from, and excitons are trapped in the portion such that the light emission efficiency is decreased. Also, the detachment of ligand causes the surface of the quantum dots to be easily oxidized by oxygen from the external environment, and results in degradation of the quantum dots. Further, the detachment of ligand promotes aggregation between quantum dots, and is lead to a decrease in the light emission efficiency. Ligands also provide an effect of dispersion stability of the quantum dots to the binder resin. Therefore, ligands capable of effectively covering the surfaces of the quantum dots increase dispersion stability of the quantum dots to the acrylate resins and allow the quantum dots to be dispersed in high concentration. Based upon the above findings, the present disclosure provides various aspects provided below.

A quantum dot-containing composition according to the present disclosure comprises a quantum dot; and a ligand having coordinating groups coordinated to a surface of the quantum dot, and the ligand is represented by Formula I.

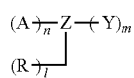

Formula I

In Formula I, A is an organic group including one or more coordinating groups selected from an amino group, a carboxy group, a mercapto group, a phosphine group, or a phosphine oxide group, Z is an (n+m+l)-valent organic linking group, R is a group including an alkyl group, an alkenyl group, or an alkynyl group, each of which may have a substituent, Y is a group having a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, or a polystyrene skeleton, n and m are each independently a number of 1 or greater, l is a number of 0 or greater, n+m+l is an integer of 3 or greater, n units of A's may be identical to or different from each other, m units of Y's may be identical to or different from each other, l units of R's may be identical to or different from each other, and, here, at least two coordinating groups are included in a molecule.

It is preferable that the ligand is represented by Formula II.

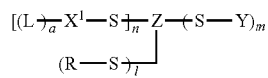

Formula II

In Formula II, L is the coordinating group, $X^1$ is an (a+1)-valent organic linking group, S is a sulfur atom. a units of L's may be identical to or different from each other. a is an integer from 1 to 2. In a case where a is 1, n is 2 or greater, and in a case where a is 2, n is 1 or greater.

It is preferable that the ligand is represented by Formula III.

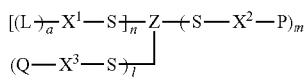

Formula III

In Formula III, $X^2$ and $X^3$ are divalent organic linking groups, P is a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, or a polystyrene skeleton, and Q is an alkyl group, an alkenyl group, or an alkynyl group each of which may have a substituent.

The quantum dot-containing composition according to the present disclosure may further comprise a polymerizable compound.

The quantum dot-containing composition according to the present disclosure may further comprise at least one polymer; and at least one solvent. The polymer may be a water-soluble polymer. The water-soluble polymer may be a polyvinyl alcohol or an ethylene-vinyl alcohol copolymer.

It is preferable that the quantum dot is at least one selected from a quantum dot having an emission center wavelength in a wavelength range of 600 nm to 680 nm, a quantum dot having an emission center wavelength in a wavelength region of 520 nm to 560 nm, or a quantum dot having an emission center wavelength in a wavelength region of 430 nm to 480 nm.

A wavelength conversion member of the present disclosure has a wavelength conversion layer obtained by curing the quantum dot-containing composition of the present disclosure. That is, the wavelength conversion layer contains a cured product of the quantum dot-containing composition of the present disclosure.

It is preferable that the wavelength conversion member according to the present disclosure further comprises a barrier film having an oxygen permeability of 1.00 cm³/m²·day·atm or less, and at least one of two main surfaces of the wavelength conversion layer is in contact with the barrier film.

It is preferable that the wavelength conversion member according to the present disclosure includes two of the barrier film, and two main surfaces of the wavelength conversion layer are in contact with the barrier films, respectively.

The thickness of the wavelength conversion layer is preferably 30 μm or less. It is preferable that the barrier film has a thickness of 30 μm or less per one barrier film. It is preferable because the wavelength conversion member within the above range can be incorporated in a small liquid crystal display device such as a smartphone.

A backlight unit according to the present disclosure comprises at least the wavelength conversion member according to the present disclosure; and a light source.

A liquid crystal display device according to the present disclosure comprises at least the backlight unit according to the present disclosure; and a liquid crystal cell.

A quantum dot-containing composition according to the present disclosure includes a quantum dot and a ligand having coordinating groups coordinated to a surface of quantum dots, and the ligand is represented by Formula I. Such a structure of the ligand in the quantum dot-containing composition according to the present disclosure allows the coordinating groups therein to be coordinated onto multiple points in a smaller region around the quantum dot, allowing the ligand to form strong coordination on the surface of the quantum dot. The strong coordination prevents the ligand from detachment from the quantum dot surface due to heat, preventing a decrease in brightness. This configuration further allows the quantum dots to be contained in high concentration, and thus a wavelength conversion layer in a thinner scale can be obtained. A wavelength conversion member, a backlight unit, and a liquid crystal display device each including the wavelength conversion layer obtained by curing such the quantum dot-containing composition in which the decrease in brightness due to heat is satisfactorily suppressed can also be obtained in a thinner scale.

DESCRIPTION OF THE PREFERRED EMBODIMENTS

Figure 1:
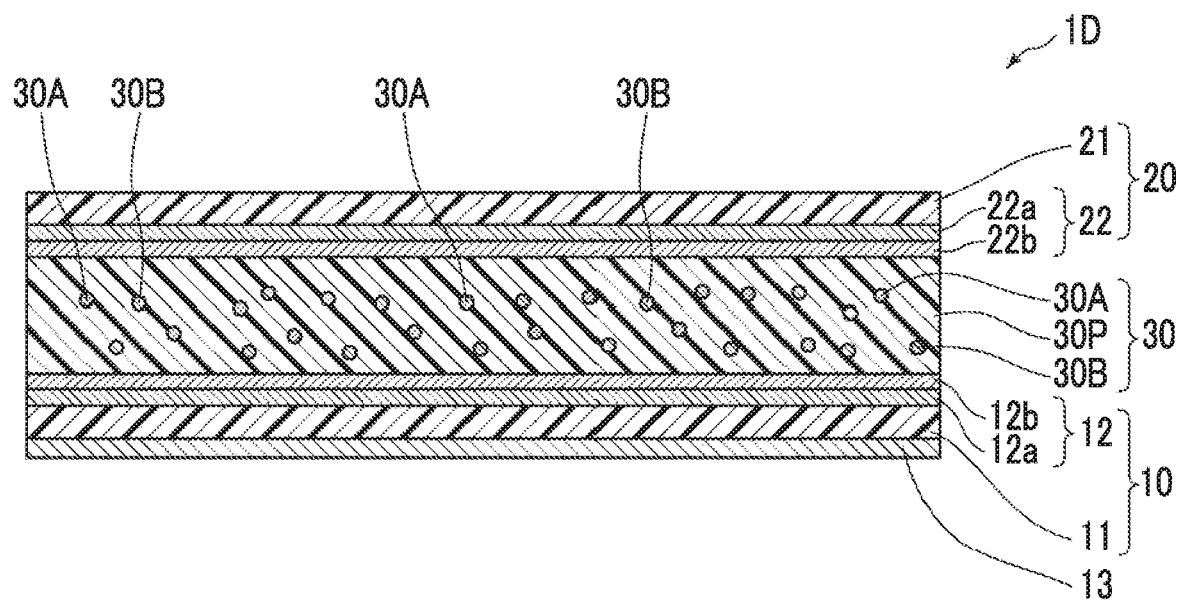
FIG. 1 is a schematic structural cross-sectional view of a wavelength conversion member according to an embodiment of the present invention.

Hereinafter, various embodiments according to the present disclosure are described with reference to the drawings. The description thereof is made with respect to a representative embodiment of the present invention, but the present invention is not limited to the embodiments.

In the present disclosure, in a case where the amount of a component in the composition is referred to and there are a plurality of substances corresponding to the component in the composition unless otherwise noted, the amount of the component refers to the total amount of the plurality of substances in the composition.

In the present specification, a numerical range represented using "to" means that the range includes numerical values before and after "to" as the lower limit and the upper limit thereof. In the present specification, "half-width" of a peak refers to the peak half-width (peak height×½). Light having an emission center wavelength in a wavelength range of 430 to 480 nm is called blue light, light having an emission center wavelength in a wavelength range of 520 to 560 nm is called green light, and light having an emission center wavelength in a wavelength range of 600 to 680 nm is called red light. The term "(meth)acryloyl group" means one or both of an acryloyl group and a methacryloyl group.

[Quantum Dot-Containing Composition]

Hereinafter, details of a quantum dot-containing composition are described.

(Quantum Dots)

The quantum dots are semiconductor nanoparticles that emit fluorescence when excited by excitation light. The quantum dot-containing composition may contain two or more quantum dots having different emission characteristics. In a case where blue light is used as the excitation light, the quantum dot-containing composition may contain quantum dots that emit fluorescence (red light) $L_R$ when excited by blue light $L_B$, and quantum dots that emit fluorescence (green light) $L_G$ when excited by the blue light $L_B$.

In a case where ultraviolet light is used as the excitation light, the quantum dot-containing composition may contain quantum dots that emit fluorescence (red light) $L_R$ when excited by ultraviolet light $L_{UV}$, quantum dots that emit fluorescence (green light) $L_G$ when excited by the ultraviolet light $L_{UV}$, and quantum dots that emit fluorescence (blue light) $L_B$ when excited by the ultraviolet light $L_{UV}$.

Examples of the quantum dots that emit the red light $L_R$ include quantum dots emitting light having an emission center wavelength in a wavelength range of 600 to 680 nm. Examples of the quantum dots that emit the green light $L_G$ include quantum dots emitting light having an emission center wavelength in a wavelength range of 520 to 560 nm. Examples of the quantum dots that emit the blue light $L_B$ include quantum dots emitting light having an emission center wavelength in a wavelength range of 430 to 480 nm.

The quantum dot-containing composition preferably contains at least one of these quantum dots.

As the quantum dots, paragraphs 0060 to 0066 of JP2012-169271A may be used as a reference, but the present invention is not limited to the content of the publication.

As the quantum dots, for example, core shell-type semiconductor nanoparticles are preferable, in view of improving durability. As the core, Group II-VI semiconductor nanoparticles, Group III-V semiconductor nanoparticles, multi-element semiconductor nanoparticles, and the like may be used. Specific examples thereof include CdSe, CdTe, CdS, ZnS, ZnSe, ZnTe, InP, InAs, and InGaP, but the present invention is not limited thereto. Among these, CdSe, CdTe, InP, and InGaP are preferable, in view of emission of visible light with high efficiency. As the shell, CdS, ZnS, ZnO, GaAs, and a complex of these may be used, but the present invention is not limited thereto. Typically, the emission wavelength of the quantum dots can be adjusted in accordance with the composition and the size of the particles.

The quantum dots may be spherical particles, may be rod-like particles, also called as quantum rods, or may be tetrapod-type particles. In view of narrowing the light emission full width at half maximum (FWHM) to enlarge the color reproduction range of the liquid crystal display device, spherical quantum dots or rod-shaped quantum dots (that is, quantum rods) are preferable.

Other than the ligand of the present disclosure described below, the quantum dots may also have a ligand having Lewis basic coordinating groups coordinated on their surfaces. Quantum dots on which such a ligand is coordinated may be used in the quantum dot-containing composition according to the present disclosure. Examples of the Lewis basic coordinating group include an amino group, a carboxy group, a mercapto group, a phosphine group, and a phosphine oxide group. Specific examples thereof include hexylamine, decylamine, hexadecylamine, octadecylamine, oleylamine, myristylamine, lauryl amine, oleic acid, mercaptopropionic acid, trioctylphosphine, and trioctylphosphine oxide. Among these, hexadecylamine, trioctylphosphine, and trioctylphosphine oxide are preferable, and trioctylphosphine oxide is particularly preferable.

The quantum dots to which these ligands are coordinated may be produced by a well-known synthesis method. For example, the synthesization can be performed in the method disclosed by the methods disclosed in C. B. Murray, D. J. Norris, M. G. Bawendi, Journal of the American Chemical Society, 1993, 115 (19), pp 8706-8715 or The Journal of Physical Chemistry B, 101, pp 9463-9475, 1997. As the quantum dots to which the ligand is coordinated, commercially available quantum dots may be used without any limitations. Examples thereof include Lumidot (manufactured by Sigma-Aldrich Co. LLC.).

In the quantum dot-containing composition according to the present disclosure, the content of the quantum dots to which the ligand is coordinated is preferably 0.01 to 10 mass % and more preferably 0.05 to 5 mass % with respect to the total mass of the polymerizable compound included in the quantum dot-containing composition.

The quantum dots according to the present disclosure may be added to the quantum dot-containing composition in the form of particles or may be added in the form of a dispersion liquid in which the quantum dots are dispersed in the solvent. It is preferable that the quantum dots are added in the form of a dispersion liquid in view of suppressing the aggregation of the particles of the quantum dots. The solvent used here is not particularly limited. Examples thereof include organic solvents such as toluene.

(Ligand)

The quantum dot-containing composition according to the present disclosure includes quantum dots, and ligand having a coordinating group that coordinates with the surfaces of the quantum dots and the ligand is represented by Formula I.

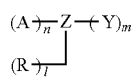

Formula I

In Formula I, A is an organic group including one or more coordinating groups selected from an amino group, a carboxy group, a mercapto group, a phosphine group, and a phosphine oxide group, Z is an (n+m+l)-valent organic linking group, R is a group containing an alkyl group, an alkenyl group, or an alkynyl group each of which may have a substituent, Y is a group having a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, and a polystyrene skeleton. n and m are each independently a number of 1 or greater, l is a number of 0 or greater, and n+m+l is an integer of 3 or greater. n units of A's may be identical to or different from each other. m units of Y's may be identical to or different from each other. l units of R's may be identical to or different from each other. Here, at least two coordinating groups are included in a molecule.

In Formula I, Z is an (n+m+l)-valent organic linking group. n+m+l is an integer of 3 or greater, is preferably 3 to 10, more preferably 3 to 8, and even more preferably 3 to 6. n and m are each independently and preferably 1 or greater, n is more preferably 2 to 5, and m is more preferably 1 to 5. l is 0 or greater and preferably 0 to 3. Particularly, n:m is preferably in the range of 1:4 to 4:1, and (m+n):l is preferably in the range of 3:2 to 5:0.

Examples of the (n+m+l)-valent organic linking group represented by Z include a group including 1 to 100 carbon atoms, 0 to 10 nitrogen atoms, 0 to 50 oxygen atoms, 1 to 200 hydrogen atoms, and 0 to 20 sulfur atoms, and the (n+m+l)-valent organic linking group may be unsubstituted or may have a substituent.

The (n+m+l)-valent organic linking group Z is preferably a group including 1 to 60 carbon atoms, 0 to 10 nitrogen atoms, 0 to 40 oxygen atoms, 1 to 120 hydrogen atoms, and 0 to 10 sulfur atoms, more preferably a group including 1 to 50 carbon atoms, 0 to 10 nitrogen atoms, 0 to 30 oxygen atoms, 1 to 100 hydrogen atoms, and 0 to 7 sulfur atoms, and particularly preferably a group including 1 to 40 carbon atoms, 0 to 8 nitrogen atoms, 0 to 20 oxygen atoms, 1 to 80 hydrogen atoms, and 0 to 5 sulfur atoms.

Specific examples of the (n+m+l)-valent organic linking group Z include the following structural unit or a group obtained by combining the following structural units (the group may form a ring structure).

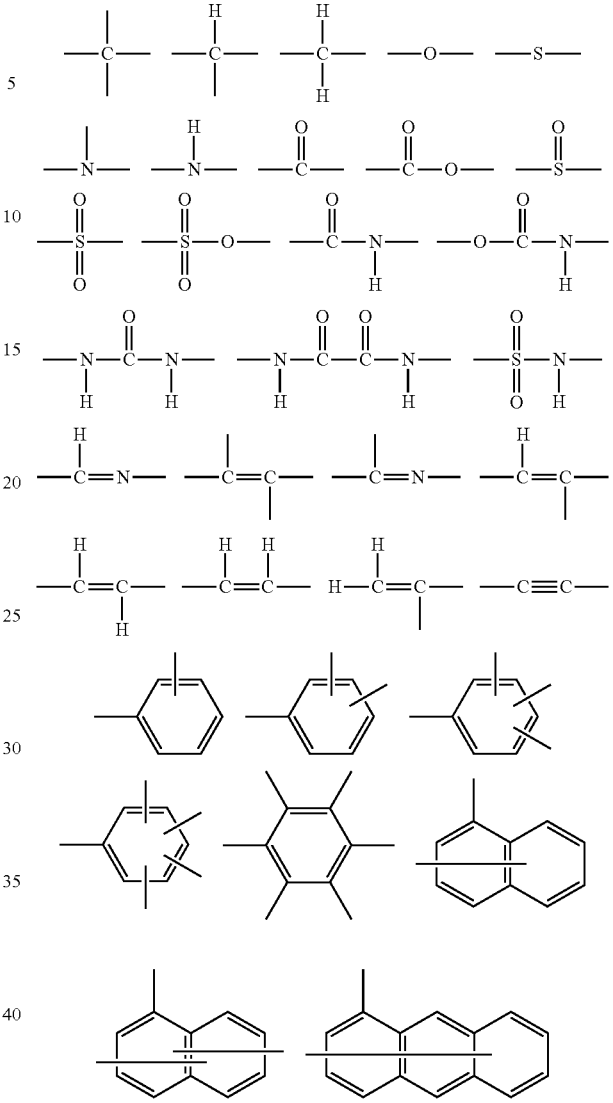

In a case where the (n+m+l)-valent organic linking group Z has a substituent, examples of the substituent include an alkyl group having 1 to 20 carbon atoms such as a methyl group and an ethyl group, an aryl group having 6 to 16 carbon atoms such as a phenyl group and a naphthyl group, an acyloxy group having 1 to 6 carbon atoms such as a hydroxyl group, an amino group, a carboxyl group, a sulfonamide group, an N-sulfonylamide group, and an acetoxy group, an alkoxy group having 1 to 6 carbon atoms such as a methoxy group and an ethoxy group, a halogen atom such as chlorine and bromine, an alkoxycarbonyl group having 2 to 7 carbon atoms such as a methoxycarbonyl group, an ethoxycarbonyl group, and a cyclohexyloxycarbonyl group, a cyano group, and a carbonate ester group such as t-butyl carbonate.

As specific examples of the (n+m+l)-valent organic linking group Z, organic linking groups (1) to (22) are provided below; however, the organic linking group Z according to the present disclosure is not limited to these. *'s in the following organic linking groups indicate positions bonded to A, Y, and R in Formula I.

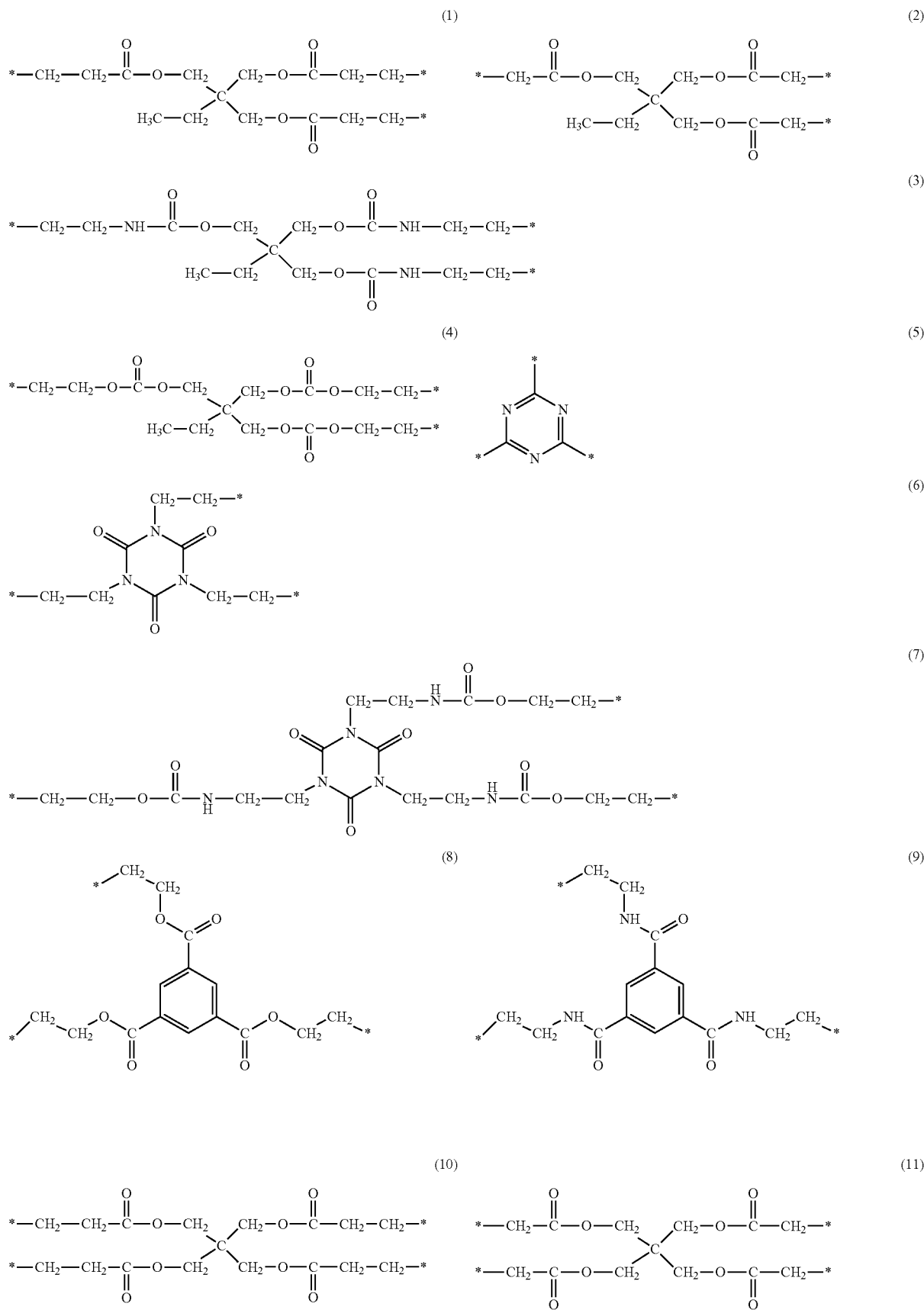

-continued
(12)
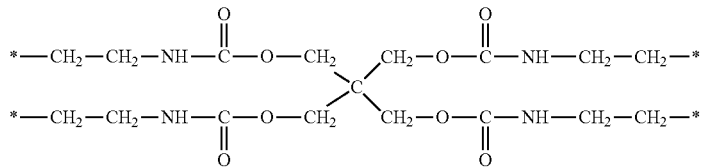
(13)
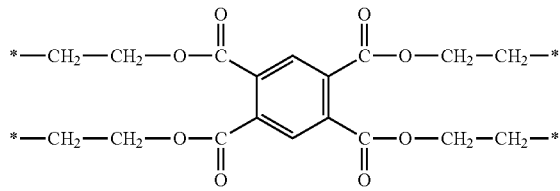
(14)
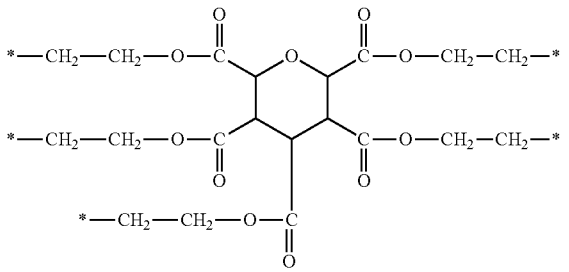
(15)
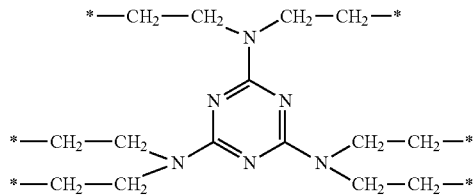
(16)
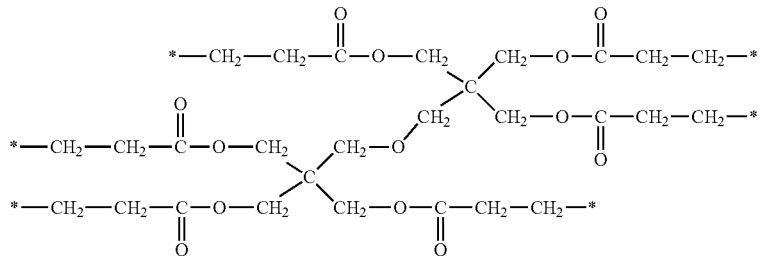
(17)
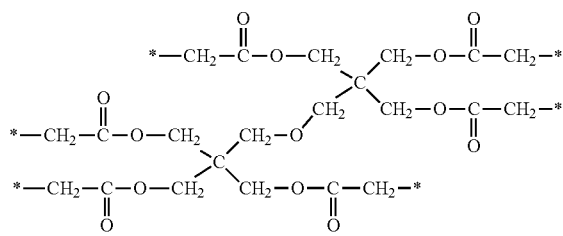
(18)
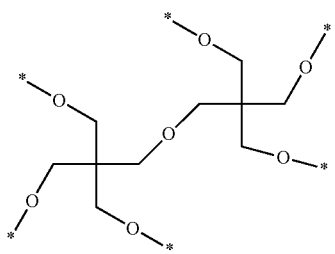
(19)
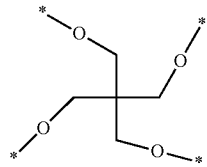
(20)
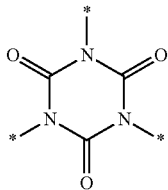

-continued (21)

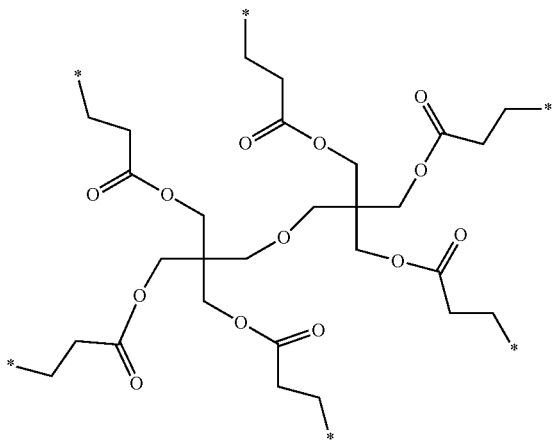

(22)

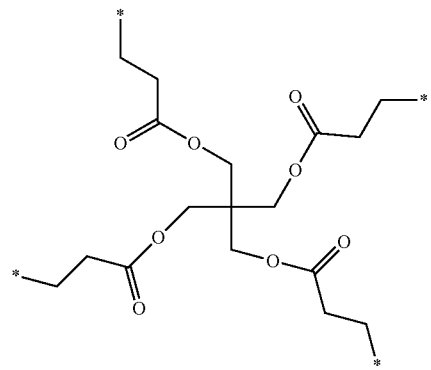

Among the specific examples, in view of availability of raw materials, ease of synthesis, and solubility in polymerizable compounds and various solvents, the (n+m+l)-valent organic linking group Z is most preferably selected from the following groups.

(18)

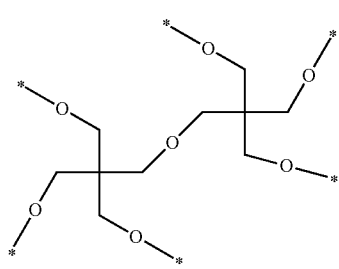

(19)

(20)

-continued (21)

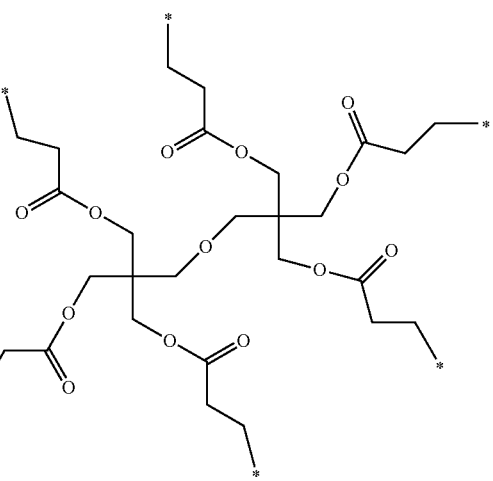

(22)

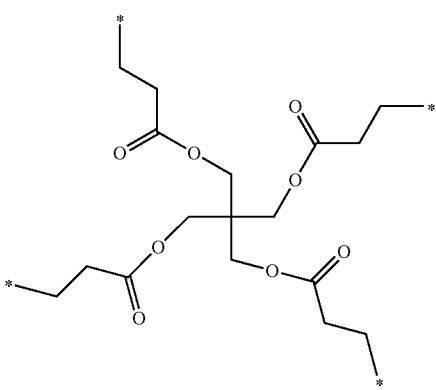

In Formula I, R is a group including an alkyl group, an alkenyl group, or an alkynyl group each of which may have a substituent. The number of carbon atoms of the group represented by R is preferably 1 to 30 and more preferably 1 to 20. Examples of the substituent include an alkyl group having 1 to 20 carbon atoms such as a methyl group and an ethyl group, an aryl group having 6 to 16 carbon atoms such as a phenyl group and a naphthyl group, a hydroxyl group, an amino group, a carboxyl group, a sulfonamide group, an N-sulfonylamide group, an acyloxy group having 1 to 6 carbon atoms such as an acetoxy group, an alkoxy group having 1 to 6 carbon atoms such as a methoxy group and an ethoxy group, a halogen atom such as chlorine and bromine, an alkoxycarbonyl group having 2 to 7 carbon atoms such as a methoxycarbonyl group, an ethoxycarbonyl group, and a cyclohexyloxycarbonyl group, a cyano group, and a carbonate ester group such as t-butyl carbonate.

In Formula I, Y is a group having a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, and a polystyrene skeleton. m units of Y's may be identical to or different from each other.

The polymer chain in the present disclosure may be a polymer, a modified product, or a copolymer including at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, and a polystyrene skeleton. Examples thereof include a polyether/polyurethane copolymer, and a copolymer of polyether/polymer of a vinyl monomer. The polymer chain may be any of a random copolymer, a block copolymer, and a graft copolymer. Among these, a polymer or a copolymer including a polyacrylate skeleton is particularly preferable.

The polymer chain is preferably soluble in the solvent. Low affinity of the polymer chain to the solvent weakens the affinity of the ligand to the dispersion medium in a case where the polymer chain is included in the ligand, for example, and thus the adsorption layer for dispersion stability may not be formed in a sufficient amount.

It is preferable that the polymer chain has a structure of enabling satisfactory dispersion in the polymerizable compound in the composition. It is preferable that the polymer chain is highly branched and the branches have steric repulsive groups mutually repulsive to each other. Such a structure allows the polymerizable compound to infiltrate between the highly branched chains, and allows the quantum dots to be satisfactorily dispersed in the polymerizable compound. In a case where the polymerizable compound is an epoxy compound, the SP value of the polymer chain is preferably 17 to 22 $MPa^{1/2}$, for example.

Although the monomer that forms the polymer chain is not particularly limited, preferred are (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth)acrylonitrile, a monomer having an acidic group, and the like.

Hereinafter, preferable examples of these monomers are described below.

Examples of (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, n-hexyl (meth)acrylate, cyclohexyl (meth)acrylate, t-butyl cyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (meth)acrylate, 3-phenoxy-2-hydroxypropyl (meth)acrylate, 2-chloroethyl (meth)acrylate, glycidyl (meth)acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-allyloxyethyl (meth)acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxypolyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, and γ-butyrolactone (meth)acrylate.

Examples of crotonic acid esters include butyl crotonate and hexyl crotonate.

Examples of vinyl esters include vinyl acetate, vinyl chloroacetate, vinyl propionate, vinyl butyrate, vinyl methoxyacetate, and vinyl benzoate.

Examples of maleic acid diesters include dimethyl maleate, diethyl maleate, and dibutyl maleate.

Examples of fumaric acid diesters include dimethyl fumarate, diethyl fumarate, and dibutyl fumarate.

Examples of itaconic acid diesters include dimethyl itaconate, diethyl itaconate, and dibutyl itaconate.

Examples of the (meth)acrylamides include (meth)acrylamide, N-methyl (meth)acrylamide, N-ethyl (meth)acrylamide, N-propyl (meth)acrylamide, N-isopropyl (meth)acrylamide, N-n-butyl acrylic (meth)amide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-nitrophenyl acrylamide, N-ethyl-N-phenylacrylamide, N-benzyl (meth)acrylamide, (meth)acryloyl morpholine, diacetone acrylamide, N-methylol acrylamide, N-hydroxyethyl acrylamide, vinyl (meth)acrylamide, N, N-diallyl (meth)acrylamide, and N-allyl (meth)acrylamide.

Examples of styrenes include styrene, methyl styrene, dimethyl styrene, trimethylstyrene, ethyl styrene, isopropyl styrene, butyl styrene, hydroxystyrene, methoxystyrene, butoxystyrene, acetoxystyrene, chlorostyrene, dichlorostyrene, bromostyrene, chloromethyl styrene, hydroxystyrene protected with a group (for example, t-Boc) that can be deprotected with an acidic substance, methyl vinyl benzoate, and α-methylstyrene.

Examples of vinyl ethers include methyl vinyl ether, ethyl vinyl ether, 2-chloroethyl vinyl ether, hydroxyethyl vinyl ether, propyl vinyl ether, butyl vinyl ether, hexyl vinyl ether, octyl vinyl ether, methoxyethyl vinyl ether, and phenyl vinyl ether.

Examples of vinyl ketones include methyl vinyl ketone, ethyl vinyl ketone, propyl vinyl ketone, and phenyl vinyl ketone.

Examples of olefins include ethylene, propylene, isobutylene, butadiene, and isoprene.

Examples of maleimides include maleimide, butylmaleimide, cyclohexylmaleimide, and phenylmaleimide.

(Meth)acrylonitrile, a heterocyclic group substituted with a vinyl group (for example, vinylpyridine, N-vinylpyrrolidone, and vinylcarbazole), N-vinylformamide, N-vinylacetamide, N-vinylimidazole, vinylcaprolactone, and the like can be used.

The ligand is preferably represented by Formula II.

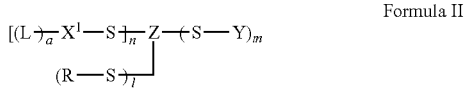

Formula II

In Formula II, L is the coordinating group, $X^1$ is an (a+1)-valent organic linking group, S is a sulfur atom. a units of L's may be identical to or different from each other. a is an integer from 1 to 2. In a case where a is 1, n is 2 or greater. In a case where a is 2, n is 1 or greater. The meanings of the symbols other than these in Formula II are the same as those in Formula I.

In a case where the ligand is represented by Formula II or Formula III, the (n+m+l)-valent organic linking group Z can specifically exemplified by the above organic linking groups (1) to (22), among which the organic linking groups (21) and (22) are particularly preferable. However, the organic linking group Z of the present disclosure is not limited to these groups. *'s in the organic linking groups indicate the positions to which the sulfur atoms in Formula II and Formula III are bonded.

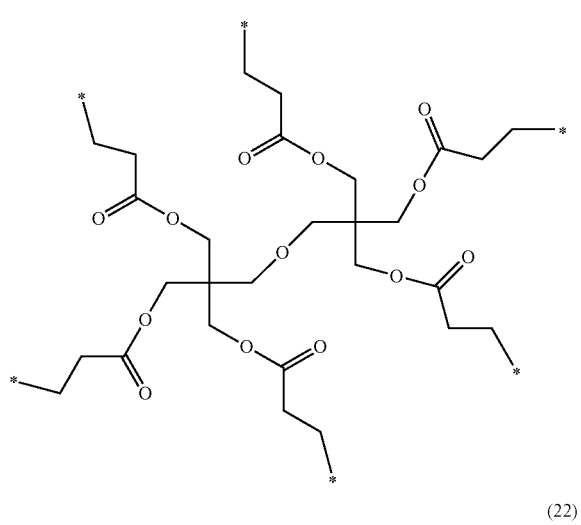

(21)

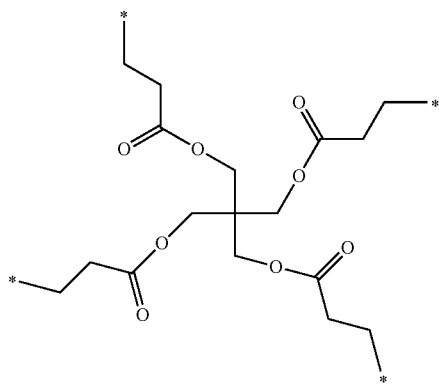

(22)

The ligand may be represented by Formula III.

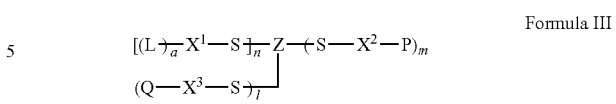

Formula III

In Formula III, $X^2$ and $X^3$ are divalent organic linking groups, P is a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, and a polystyrene skeleton. Q is an alkyl group, an alkenyl group, or an alkynyl group each of which may have a substituent.

The meanings of the symbols other than these in Formula III are the same as those in Formula II.

In Formula III, $X^2$ and $X^3$ represent a divalent organic linking group. Examples of the divalent organic linking group include a group including 1 to 100 carbon atoms, 0 to 10 nitrogen atoms, 0 to 50 oxygen atoms, 1 to 200 hydrogen atoms, and 0 to 20 sulfur atoms, and may be unsubstituted or may have a substituent.

The divalent organic linking group $X^2$ and $X^3$ are preferably a single bond or a divalent organic linking group including 1 to 50 carbon atoms, 0 to 8 nitrogen atoms, 0 to 25 oxygen atoms, 1 to 100 hydrogen atoms, and 0 to 10 sulfur atoms. A single bond or a divalent organic linking group including 1 to 30 carbon atoms, 0 to 6 nitrogen atoms, 0 to 15 oxygen atoms, 1 to 50 hydrogen atoms, and 0 to 7 sulfur atoms is more preferable. A single bond or a divalent organic linking group including 1 to 10 carbon atoms, 0 to 5 nitrogen atoms, 0 to 10 oxygen atoms, 1 to 30 hydrogen atoms, and 0 to 5 sulfur atoms is particularly preferable.

In a case where the divalent organic linking groups $X^2$ and $X^3$ have substituents, examples of the substituent include an alkyl group having 1 to 20 carbon atoms such as a methyl group and an ethyl group, an aryl group having 6 to 16 carbon atoms such as a phenyl group and a naphthyl group, an acyloxy group having 1 to 6 carbon atoms such as a hydroxyl group, an amino group, a carboxyl group, a sulfonamide group, an N-sulfonylamide group, and an acetoxy group, an alkoxy group having 1 to 6 carbon atoms such as a methoxy group and an ethoxy group, a halogen atom such as chlorine and bromine, an alkoxycarbonyl group having 2 to 7 carbon atoms such as a methoxycarbonyl group, an ethoxycarbonyl group, and a cyclohexyloxycarbonyl group, a cyano group, and a carbonate ester group such as t-butyl carbonate.

Specific examples of the divalent organic linking groups $X^2$ and $X^3$ include a group (may form a ring structure) obtained by combining the following structural units.

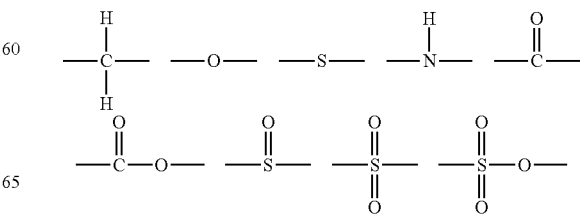

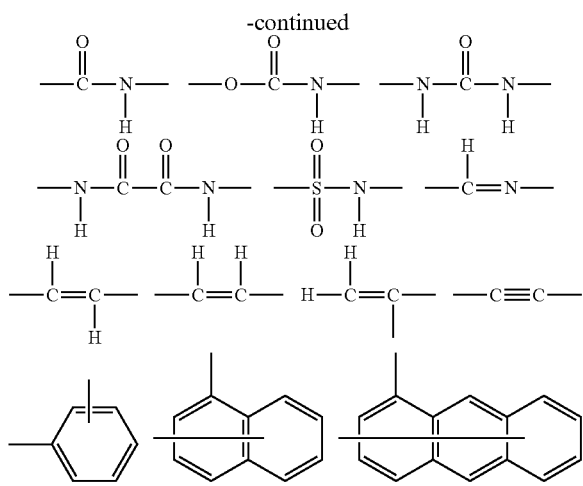

The (a+1)-valent organic linking group $X^1$ is preferably a group including 1 to 60 carbon atoms, 0 to 10 nitrogen atoms, 0 to 40 oxygen atoms, 1 to 120 hydrogen atoms, and 0 to 10 sulfur atoms, more preferably a group including 1 to 50 carbon atoms, 0 to 10 nitrogen atoms, 0 to 30 oxygen atoms, 1 to 100 hydrogen atoms, and 0 to 7 sulfur atoms, and particularly preferably a group including 1 to 40 carbon atoms, 0 to 8 nitrogen atoms, 0 to 20 oxygen atoms, 1 to 80 hydrogen atoms, and 0 to 5 sulfur atoms.

In a case where the (a+1)-valent organic linking group $X^1$ has a substituent, examples of the substituent include an alkyl group having 1 to 20 carbon atoms such as a methyl group and an ethyl group, an aryl group having 6 to 16 carbon atoms such as a phenyl group and a naphthyl group, a hydroxyl group, an amino group, a carboxyl group, a sulfonamide group, an N-sulfonylamide group, an acyloxy group having 1 to 6 carbon atoms such as an acetoxy group, an alkoxy group having 1 to 6 carbon atoms such as a methoxy group and an ethoxy group, a halogen atom such as chlorine and bromine, an alkoxycarbonyl group having 2 to 7 carbon atoms such as a methoxycarbonyl group, an ethoxycarbonyl group, and a cyclohexyloxycarbonyl group, a cyano group, and a carbonate ester group such as t-butyl carbonate.

Preferable examples of A in Formula I in a case where n is 1 are as follows. *'s in these groups indicate positions to which Z is bonded.

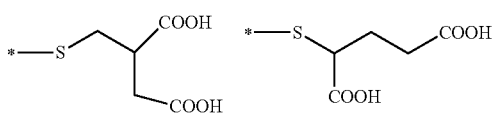

In A, the length of $X^1$ is shorter than about 1 nm, and has a plurality of coordinating groups in the range of the length. This structure allows the ligand to be multipoint adsorbed to the surface of the quantum dots in higher density, and thus to be strongly coordinated. Thus, the ligand covers the surfaces of the quantum dots without being detached from the quantum dots so that the generation of a surface state on surfaces of the quantum dots, the oxidation of quantum dots, and the aggregation of quantum dots are all prevented, whereby suppression of the decrease in light emission efficiency is achieved. The structure also allows the ligand according to the present disclosure to infiltrate gaps between ligands, even if there is another ligand already coordinated to the quantum dots and contribute to suppressing a decrease in light emission efficiency of the quantum dots.

(Synthesis Method of Ligand)

The ligand in the quantum dot-containing composition according to the embodiment of the present invention may be synthesized in well-known synthesis methods. For example, the ligand may be synthesized in the method disclosed in JP2007-277514A.

(Polymerizable Compound)

The quantum dot-containing composition according to the embodiment of the present invention may include a polymerizable compound. The polymerizable compound is preferably an acrylic compound. The polymerizable compound is preferably a monofunctional or polyfunctional (meth)acrylate monomer, and may be a prepolymer or a polymer of monomers insofar as polymerizability is exhibited. In the present specification, "(meth)acrylate" means one or both of acrylate and methacrylate.

Examples of the monofunctional (meth)acrylate monomer include acrylic acid, methacrylic acid, and derivatives thereof, and specific examples thereof include a monomer having one polymerizable unsaturated bond ((meth)acryloyl group) of (meth)acrylic acid in a molecule. Specific Examples thereof include alkyl (meth)acrylate having an alkyl group having 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, and stearyl (meth)acrylate.

Examples of the difunctional (meth)acrylate monomer include neopentyl glycol di(meth)acrylate, 1,9-nonanediol di(meth)acrylate, and dipropylene glycol di(meth)acrylate.

Examples of the trifunctional (meth)acrylate monomer include ECH-modified glycerol tri(meth)acrylate, EO-modified glycerol tri(meth)acrylate, and PO-modified glycerol tri(meth)acrylate.

In view of further improving the heat resistance of the wavelength conversion layer, the (meth)acrylate monomer is preferably an alicyclic acrylate. Examples of the monofunctional (meth)acrylate monomer include dicyclopentenyl (meth)acrylate, dicyclopentanyl (meth)acrylate, and dicyclopentenyloxyethyl (meth)acrylate. Examples of the difunctional (meth)acrylate monomer include tricyclodecanedimethanol di(meth)acrylate.

The total amount of the polymerizable compound in the quantum dot-containing composition is preferably 70 to 99 parts by mass and more preferably 85 to 97 parts by mass with respect to 100 parts by mass of the quantum dot-containing composition in view of handleability and curing properties of the composition.

(Polymerization Initiator)

The quantum dot-containing composition may include well-known photoradical polymerization initiators and cationic polymerization initiators as the polymerization initiator. Examples of the photopolymerization initiator include commercially available Irgacure (registered trademark) series from BASF SE, for example, Irgacure 290, Irgacure 651, Irgacure 754, Irgacure 184, Irgacure 2959, Irgacure 907, Irgacure 369, Irgacure 379, and Irgacure 819, Irgacure TPO, and Irgacure 1173. In a commercially available Esacure (registered trademark)) series manufactured by Lamberti S.p.A., examples thereof include Esacure TZM, Esacure TZT, and Esacure KTO46. Well-known radical polymerization initiators or cationic polymerization initiators may be also included. For example, paragraph 0037 of JP2013-043382A and paragraphs 0040 to 0042 of JP2011-159924A may be used as references.

The content of the photopolymerization initiator is preferably 0.1 to 10 parts by mass, more preferably 0.2 to 8 parts by mass, and even more preferably 0.2 to 5 parts by mass with respect to 100 parts by mass of the polymerizable composition.

(Polymer)

The quantum dot-containing composition according to the present disclosure may include a polymer. The polymer may be a water-soluble polymer. The water-soluble polymer may be polyvinyl alcohol or an ethylene-vinyl alcohol copolymer. Examples of the polymer include poly(meth)acrylate, poly(meth)acrylamide, polyester, polyurethane, polyurea, polyamide, polyether, and polystyrene.

(Other Additives)

The quantum dot-containing composition according to the present disclosure may contain a viscosity adjuster and a silane coupling agent.

—Viscosity Adjuster—

The quantum dot-containing composition may include a viscosity adjuster, if necessary. By adding the viscosity adjuster, the viscosity of the quantum dot-containing composition can be adjusted as desired. The viscosity adjuster is preferably a filler having a particle diameter of 5 nm to 300 nm. The viscosity adjuster may be a thixotropic agent. In the present disclosure, thixotropic properties refer to properties of decreasing the viscosity with according to the increase of the shear rate in a liquid composition and the thixotropic agent refers to a material having a function of applying thixotropic properties to a composition by causing this to be included in the liquid composition. Specific Examples of the thixotropic agent include fumed silica, alumina, silicon nitride, titanium dioxide, calcium carbonate, zinc oxide, talc, mica, feldspar, kaolinite (kaolin clay), pyrophyllite (wax rock), sericite (silk mica), bentonite, smectitevermiculites (montmorillonite, beidellite, nontronite, saponite, and the like), organic bentonite, and organic smectite.

—Silane Coupling Agent—

The quantum dot-containing composition may further include a silane coupling agent. The wavelength conversion layer formed of the polymerizable composition including a silane coupling agent can exhibit excellent light fastness since adhesiveness to the adjacent layer becomes strong due to the silane coupling agent. This is mainly because the silane coupling agent contained in the wavelength conversion layer forms a covalent bond with a surface of the adjacent layer or a constituent component of the layer due to hydrolysis reaction or condensation reaction. At this point, it is preferable to provide an inorganic layer described below as the adjacent layer. In a case where the silane coupling agent has a reactive functional group such as a radical polymerizable group, the forming a crosslinked structure with the monomer component forming the wavelength conversion layer can contribute to the adhesiveness improvement between the wavelength conversion layer and the adjacent layer. According to the present specification, the silane coupling agent included in the wavelength conversion layer has a meaning of also including a silane coupling agent in the form after the reaction as above.

As the silane coupling agent, well-known silane coupling agents can be used without limitation. In view of the adhesiveness, examples of the preferable silane coupling agent include a silane coupling agent represented by Formula (1) of JP2013-043382A. With respect to the details thereof, disclosures of paragraphs 0011 to 0016 of JP2013-043382A may be used as references. The used amount of the additive such as the silane coupling agent is not particularly limited, and can be suitably set.

The method of preparing the quantum dot-containing composition is not particularly limited, and may be performed according to a general preparation procedure of the polymerizable composition.

Subsequently, with reference to the drawings, a wavelength conversion member according to an embodiment of the present disclosure, and a backlight unit including the wavelength conversion member. FIG. 1 is a schematic structural cross-sectional view of a wavelength conversion member according to the present embodiment.

[Wavelength Conversion Member]

As illustrated in FIG. 1, a wavelength conversion member 1D according to the present embodiment includes a wavelength conversion layer 30 obtained by curing the quantum dot-containing composition and barrier films 10 and 20 disposed on both main surfaces of the wavelength conversion layer 30. Here, the "main surface" refers to a surface (front surface or back surface) of the wavelength conversion layer disposed on a viewing side or a backlight side in a case where the wavelength conversion member is used in the display device described below. The same is applied to the main surfaces of the other layers or members. The barrier films 10 and 20 respectively include barrier layers 12 and 22 and supports 11 and 21, respectively from the wavelength conversion layer 30. Hereinafter, details of the wavelength conversion layer 30, the barrier films 10 and 20, the supports 11 and 21, and the barrier layers 12 and 22 are described.

(Wavelength Conversion Layer)

As illustrated in FIG. 1, with respect to the wavelength conversion layer 30, quantum dots 30A that emit the fluorescence (red light) $L_R$ excited by the blue light $L_B$ and quantum dots 30B that emit fluorescence (green light) $L_G$ excited by the blue light $L_B$ are dispersed in an organic matrix 30P, and the quantum dots 30A and 30B in FIG. 1 are described largely for easy visual recognition, but a diameter of the quantum dots, for example, is in the range of 2 to 7 nm with respect to 10 to 100 μm of the thickness of the wavelength conversion layer 30, in practice.

The ligands according to the present disclosure are coordinated to the surfaces of the quantum dots 30A and 30B. The wavelength conversion layer 30 is obtained by curing the quantum dot-containing composition including the quantum dots 30A and 30B to which the ligands according to the present disclosure are coordinated, the polymerizable compound, and the polymerization initiator due to the light irradiation.

The organic matrix 30P is obtained by curing the polymerizable compound due to light irradiation or heat.

The thickness of the wavelength conversion layer 30 is preferably in the range of 1 to 500 μm, more preferably in the range of 10 to 100 μm, and even more preferably in the range of 10 to 50 μm. In a case where the thickness is 1 μm or greater, the high wavelength conversion effect can be obtained, and thus is preferable. If the thickness is 500 μm or less, in a case where the wavelength conversion layer 30 is combined with the backlight unit, it is possible to cause the backlight unit to be thin, and thus is preferable.

According to the embodiment, an embodiment using blue light as a light source is used, in the wavelength conversion layer 30, the quantum dots 30A that emit the fluorescence (red light) $L_R$ excited by the ultraviolet light $L_{UV}$ in the organic matrix 30P, the quantum dots 30B that emit the fluorescence (green light) $L_G$ excited by the ultraviolet light $L_{UV}$, and the quantum dots 30C (as illustrated) that emit the fluorescence (blue light) $L_B$ excited the ultraviolet light $L_{UV}$ may be dispersed. The wavelength conversion layer may have any shape without particular limitation.

(Barrier Film)

The barrier films 10 and 20 are films having a gas barrier function to block oxygen. According to the present embodiment, the barrier layers 12 and 22 are respectively included in the supports 11 and 21. Due to the presence of the supports 11 and 21, the strength of the wavelength conversion member 1D is improved, and the respective layers can be easily formed.

According to the present embodiment, the barrier films 10 and 20 in which the barrier layers 12 and 22 are supported by the supports 11 and 21 are provided, but the barrier layers 12 and 22 may not be supported by the supports 11 and 21. According to the present embodiment, the wavelength conversion member in which the barrier layers 12 and 22 are included to be adjacent to two main surfaces of the wavelength conversion layer 30 is provided. However, in a case where the supports 11 and 21 have sufficient barrier properties, the barrier layer may only include the supports 11 and 21.

Regarding the barrier films, an aspect in which two barrier films (barrier films 10 and 20) are included in the wavelength conversion member as provided in the present embodiment is preferable, although an aspect in which only one barrier film is included is also possible.

In the barrier films 10 and 20, the total light transmittance in the visible light region is preferably 80% or greater and more preferably 90% or greater. The visible light region refers to a wavelength range of 380 to 780 nm, and the total light transmittance indicates an average value of the light transmittance in the visible light region.

The oxygen transmittance (also referred to as oxygen permeability) of the barrier films 10 and 20 is preferably 1.00 cm$^3$/(m$^2$·day·atm) or less. Here, the oxygen transmittance is a value measured by using an oxygen gas transmittance determination device (product name: "OX-TRAN 2/20", manufactured by MOCON Inc.) under the conditions of the measuring temperature of 23° C. and relative humidity of 90%. The oxygen transmittance of the barrier films 10 and 20 is more preferably 0.10 cm$^3$/(m$^2$·day·atm) or less and even more preferably 0.01 cm$^3$/(m$^2$·day·atm) or less. The oxygen transmittance of 1.00 cm$^3$/(m$^2$·day·atm) is 1.14× 10$^{-1}$ fm/Pa·s in terms of the SI unit system.

(Support)

In the wavelength conversion member 1D, at least one of the main surfaces of the wavelength conversion layer 30 is supported by a support 11 or 21. According to the present embodiment, in the wavelength conversion layer 30, it is preferable that the front and back main surfaces of the wavelength conversion layer 30 are supported by the supports 11 and 21.

In view of impact resistance of the wavelength conversion member or the like, the average film thickness of the supports 11 and 21 is preferably 10 μm to 500 μm, more preferably 20 μm to 400 μm, and preferably 30 μm to 300 μm. As a case where the concentrations of the quantum dots 30A and 30B included in the wavelength conversion layer 30 are decreased or a case where the thickness of the wavelength conversion layer 30 is decreased, in an aspect in which the retroreflection of light is increased, it is preferable that the absorbance of light at a wavelength of 450 nm is decreased. Therefore, in view of suppressing the decrease in brightness, the average film thicknesses of the supports 11 and 21 are preferably 40 μm or less and even more preferably 25 μm or less.

In order to decrease the concentration of the quantum dots 30A and 30B included in the wavelength conversion layer 30 or in order to decrease the thickness of the wavelength conversion layer 30, it is required to increase the number of times for which the excitation light passes through the wavelength conversion layer, by providing means for increasing retroreflection of light, for example, providing a plurality of prism sheets in the retroreflecting member of the backlight unit described below for maintaining the LCD display color. Accordingly, the support is preferably a transparent support which is transparent to visible light.

Here, the expression "transparent to visible light" means that the light transmittance in the visible light region is 80% or greater and preferably 85% or greater. The light transmittance used as the transparency scale can be calculated by measuring the total light transmittance and the scattered light quantities in the method disclosed in JIS-K7105, that is, by using an integrating spherical light transmittance measuring device and subtracting the diffuse transmittance from the total light transmittance. With respect to the support, paragraphs 0046 to 0052 of JP2007-290369A and paragraphs 0040 to 0055 of JP2005-096108A may be used as references.

In the supports 11 and 21, it is preferable that the in-plane retardation Re (589) at the wavelength of 589 nm is 1,000 nm or less, more preferably 500 nm or less, and even more preferably 200 nm or less.

After the wavelength conversion member 1D is produced, in a case where whether foreign matters or defects exist or not is examined, two polarizing plates are disposed in an extinction position, the wavelength conversion member is interposed therebetween and observed so as to easily observe foreign matters or defects. In a case where the Re (589) of the support is in the range described above, in a case of examination using the polarizing plate, foreign matters or defects are easily found, and thus the range is preferable.

Here, Re (589) is measured by causing light at an input wavelength of 589 nm to be incident in normal direction to the film using AxoScan OPMF-1 (manufactured by Optoscience).

As the supports 11 and 21, a support having barrier properties against oxygen and moisture is preferable. Preferable examples of the support include a polyethylene terephthalate film, a film formed of a polymer having a cyclic olefin structure, and a polystyrene film.

(Barrier Layer)

The barrier layers 12 and 22 respectively include organic layers 12a and 22a and inorganic layers 12b and 22b in an order from the supports 11 and 21. The organic layers 12a and 22a are provided between the inorganic layers 12b and 22b and the wavelength conversion layer 30.

The barrier layers 12 and 22 are formed by forming films on the surfaces of the supports 11 and 21. Accordingly, the barrier films 10 and 20 include the supports 11 and 21 and the barrier layers 12 and 22 provided thereon. In a case where the barrier layers 12 and 22 are provided, the support preferably has high heat resistance. In the wavelength conversion member 1D, the layers in the barrier films 10 and 20 that are adjacent to the wavelength conversion layer 30 may be inorganic layers or may be an organic layer, and are not particularly limited.

In a case where the barrier layers 12 and 22 include a plurality of layers, barrier properties can be further increased, and thus it is preferable that the barrier layers 12 and 22 include a plurality of layers, in view of improvement of light fastness. However, as the number of layers increases, the light transmittance of the wavelength conversion member tends to decrease, and thus it is preferable that the design is performed considering satisfactory light transmittance and satisfactory barrier properties.

—Inorganic Layer—

The inorganic layer is a layer using an inorganic material as a main component, is preferably a layer in which inorganic material occupies by 50 mass % or greater, more by 80 mass % or greater, and particularly by 90 mass % or greater is preferable, and is most preferably a layer formed only of an inorganic material. The inorganic layers 12b and 22b suitable for the barrier layers 12 and 22 are not particularly limited, and various inorganic compounds such as metal, inorganic oxide, nitride, and oxynitride can be used. As the elements included in the inorganic material, silicon, aluminum, magnesium, titanium, tin, indium, and cerium are preferable, and one or two or more kinds of these may be included. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. As the inorganic layer, a metal film, for example, an aluminum film, a silver film, a tin film, a chromium film, a nickel film, or a titanium film may be provided.

Among the above materials, an inorganic layer including silicon oxide, silicon nitride, silicon oxynitride, silicon carbide, or aluminum oxide is particularly preferable. Since the inorganic layer formed of these materials has satisfactory adhesiveness to an organic layer, even in a case where there are pin holes in the inorganic layer, the pin holes are effectively filled with the organic layer, and barrier properties can be further increased.

In view of suppressing absorption of the light in the barrier layer, silicon nitride is most preferable.

The method of forming an inorganic layer is not particularly limited, and various film forming methods in which the film forming material can be evaporated or scattered and can be deposited on the vapor deposited surface.

Examples of the method of forming an inorganic layer include a vacuum deposition method in which an inorganic material such as inorganic oxide, inorganic nitride, inorganic oxynitride, or metal is heated and vapor deposited; an oxidation reaction evaporation method in which an inorganic material is used as a raw material and is oxidized and vaporized by introducing oxygen gas; a sputtering method in which an inorganic material is used as a target raw material and is vapor deposited by introducing argon gas and oxygen gas and performing sputtering; a physical vapor deposition method (PVD method) such as an ion plating method in which an inorganic material is heated by a plasma beam generated by a plasma gun and vapor deposited, and, in a case where a vapor deposited film of silicon oxide is formed, a plasma chemical vapor deposition method (CVD method) in which an organic silicon compound is used as a raw material.

The thickness of the inorganic layer may be 1 nm to 500 nm, preferably 5 nm to 300 nm, and particularly more preferably 10 nm to 150 nm. In a case where the thickness of the inorganic layer is in the range described above, satisfactory barrier properties can be realized, absorption of light in the inorganic layer can be suppressed, and a wavelength conversion member having higher light transmittance can be provided.

—Organic Layer—

The organic layer is a layer using an organic material as a main component, and is preferably a layer in which the layer in which organic material occupies by 50 mass % or greater, more by 80 mass % or greater, and particularly by 90 mass % or greater. As the organic layer, paragraphs 0020 to 0042 of JP2007-290369A and paragraphs 0074 to 0105 of JP2005-096108A may be used as references. The organic layer preferably includes a cardo polymer. This is because, adhesiveness between the organic layer and the adjacent layer is satisfactory, particularly, adhesiveness to the inorganic layer is also satisfactory, and excellent barrier properties can be accordingly realized. As the details of the cardo polymer, paragraphs 0085 to 0095 disclosed in JP2005-096108A described above may be used as references. The film thickness of the organic layer is preferably in the range of 0.05 μm to 10 μm, and among these, it is preferable that the film thickness is in the range of 0.5 to 10 μm. In a case where the organic layer is formed in a set coating method, the film thickness of the organic layer is in the range of 0.5 to 10 μm, and among these, it is preferable that the film thickness is in the range of 1 μm to 5 μm. In a case where the organic layer is formed in a dry coating method, the film thickness is in the range of 0.05 μm to 5 μm, and among these, it is preferable that the film thickness is in the range of 0.05 μm to 1 μm. This is because, in a case where the film thickness of the organic layer formed in the wet coating method or the dry coating method is in the range described above, adhesiveness to the inorganic layer can be caused to be more satisfactory.

With respect to other details of the inorganic layer and the organic layer, disclosure in JP2007-290369A, JP2005-096108A, and further US2012/0113672A1 described above may be used as references.

In the wavelength conversion member 1D, the wavelength conversion layer, the inorganic layer, the organic layer, and the support are laminated in this order, or the support is disposed between the inorganic layer and the organic layer, between two organic layers, or two inorganic layers, to be laminated.

(Unevenness Imparting Layer)

An unevenness imparting layer 13 for imparting unevenness is preferably provided on a surface of the barrier film 10, the surface being on a side opposite to the wavelength conversion layer 30 side surface. The unevenness imparting layer 13 is preferable because in a case where the unevenness imparting layer 13 is provided on the barrier film 10, blocking properties and slipping properties of the barrier film can be improved. The unevenness imparting layer is preferably a layer containing particles. Examples of the particles include inorganic particles such as silica, alumina, and metal oxide or organic particles such as crosslinked polymer particles. It is preferable that the unevenness imparting layer and the wavelength conversion layer of the barrier film are provided on the opposite surface, but may be provided on both surfaces.

The wavelength conversion member 1D can have a light scattering function to efficiently bring out the fluorescence of quantum dots to the outside. The light scattering function may be provided inside the wavelength conversion layer 30 or a layer having a light scattering function may be separately provided as the light scattering layer. The light scattering layer may be provided on the surface on the wavelength conversion layer 30 side of a barrier layer 22 and may be provided on an opposite surface of the wavelength conversion layer of the support. In a case where the unevenness imparting layer is provided, it is preferable that the unevenness imparting layer is a layer that may also be used as the light scattering layer.

<Method of Manufacturing Wavelength Conversion Member>

Subsequently, an example of a method of manufacturing the wavelength conversion member 1D in an aspect of having the barrier films 10 and 20 including the barrier layers 12 and 22 on the supports 11 and 21 on the both surfaces of the wavelength conversion layer 30 is described.

According to the present embodiment, the wavelength conversion layer 30 can be formed by coating the surfaces of the barrier films 10 and 20 with a prepared quantum dot-containing composition and curing the prepared quantum dot-containing composition with light irradiation or heating. Examples of the coating method include the well-known coating methods such as a curtain coating method, a dip coating method, a spin coating method, a printing coating method, a spray coating method, a slot coating method, a roll coating method, a slide coating method, a blade coating method, a gravure coating method, and a wire bar method.

The curing condition can be appropriately set according to the kinds of the used polymerizable compound or the composition of the quantum dot-containing composition. In a case where the quantum dot-containing composition is a composition including a solvent, a drying treatment can be performed before curing in order to remove the solvent.

The quantum dot-containing composition may be cured in a state in which the quantum dot-containing composition is sandwiched between two supports. An aspect of a step of manufacturing a wavelength conversion member including a curing treatment is described below with reference to FIGS. 2 and 3. However, the manufacturing method of the wavelength conversion member in the present disclosure is not limited to the aspect.

Figure 2:
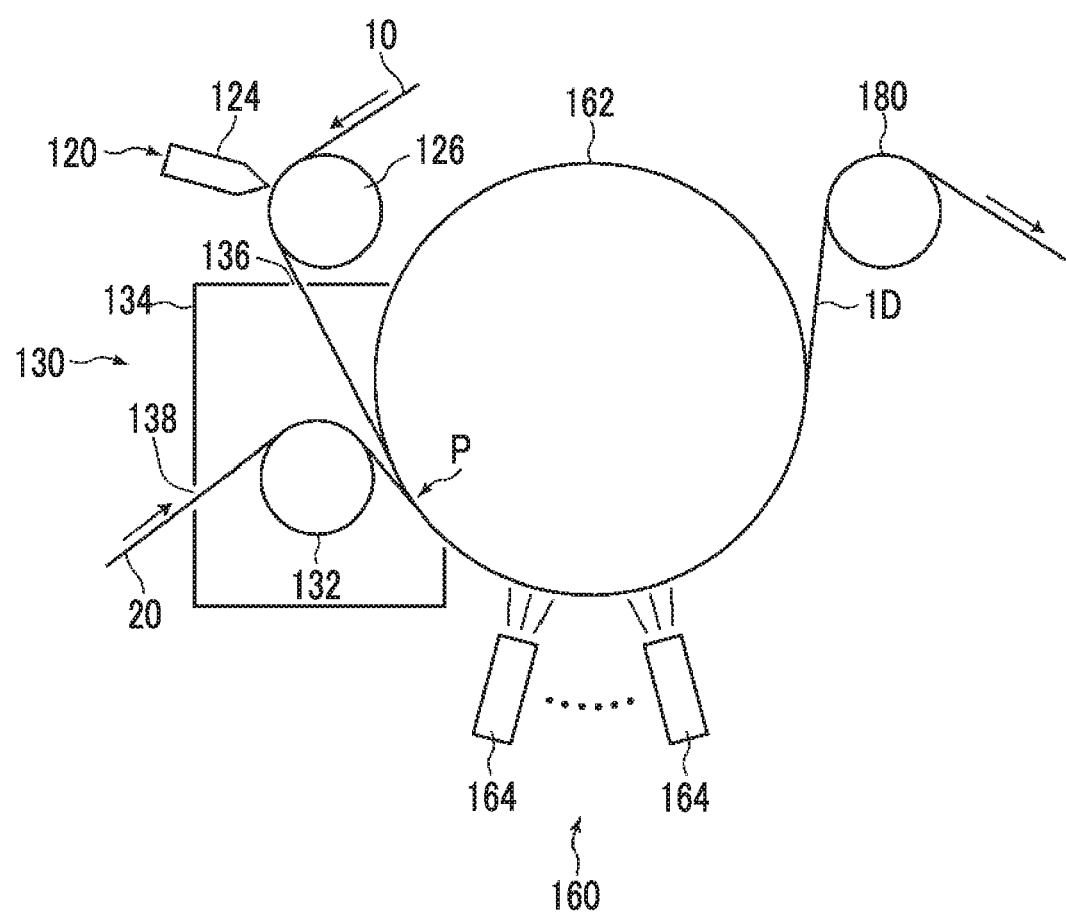
FIG. 2 is a schematic structural view illustrating an example of a manufacturing device of the wavelength conversion member.
Figure 3:
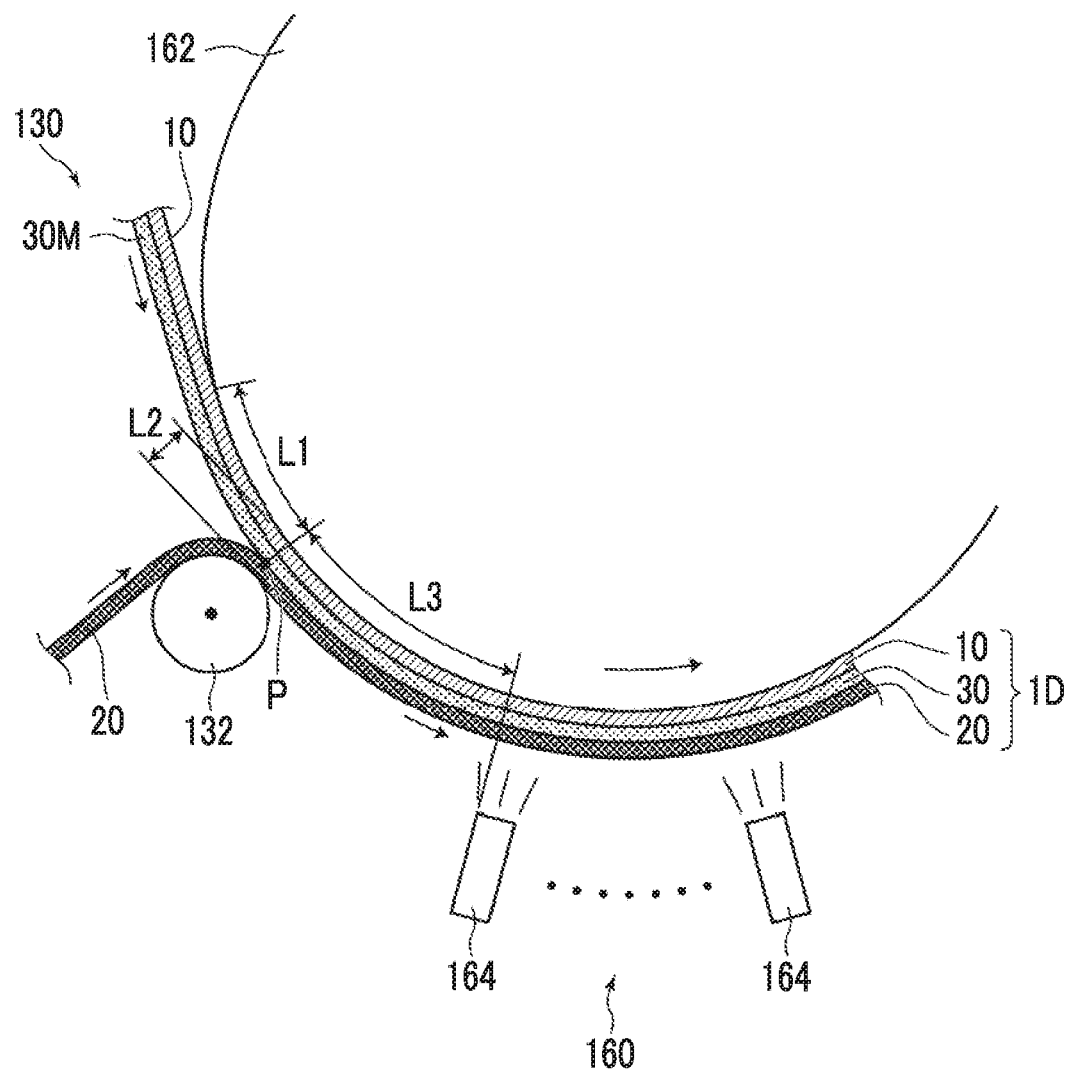
FIG. 3 is a partially enlarged view of the manufacturing device illustrated in FIG. 2.

FIG. 2 is a schematic structural view of an example of a manufacturing device of the wavelength conversion member 1D, and FIG. 3 is a partially enlarged view of the manufacturing device illustrated in FIG. 2.

The manufacturing device of the present embodiment includes a sending machine (not illustrated), a coating unit 120 that coats the first barrier film 10 with the quantum dot-containing composition to form a coating film (coating film 30M in FIG. 3), a laminating unit 130 obtained by bonding a second barrier film 20 to the coating film 30M and holding the coating film 30M between the first barrier film 10 and the second barrier film 20, a curing unit 160 that cures the coating film 30M, and a winding machine (not illustrated).

A step of manufacturing a wavelength conversion member using the manufacturing device illustrated in FIGS. 2 and 3 at least includes a step of forming a coating film and coating a surface of the first barrier film 10 (hereinafter, referred to as a "first film") continuously transported, with the quantum dot-containing composition, a step of laminating (overlapping) the second barrier film 20 (hereinafter, referred to as a "second film") continuously transported, on the coating film and sandwiching the coating film between the first film and the second film, and a step of forming a wavelength conversion layer (cured layer) by winding any one of the first film and the second film in a state in which the coating film is held between the first film and the second film to the backup roller and polymerizing and curing the coating film by light irradiating while continuously transporting the coating film. According to the present embodiment, barrier films having barrier properties against oxygen or water are used in both of the first film and the second film. According to this aspect, the wavelength conversion member 1D in which the both surfaces of the wavelength conversion layer are protected by the barrier films can be obtained. The wavelength conversion member 1D may be a wavelength conversion member in which one surface is protected by a barrier film, and in this case, it is preferable that the barrier film side is used as a side close to the external air.

Specifically, first, the first film 10 is continuously transported from the sending machine (not illustrated) to the coating unit 120. For example, the first film 10 is sent in the transportation speed of 1 to 50 m/minute from the sending machine. Here, the transportation speed of the first film 10 is not limited to the above transportation speed. In a case of sending, for example, the tension of 20 to 150 N/m and preferably the tension of 30 to 100 N/m is applied to the first film 10.

In the coating unit 120, the surface of the first film 10 continuously transported is coated with the quantum dot-containing composition (hereinafter, referred to as a "coating solution") and the coating film 30M (see FIG. 3) is formed. In the coating unit 120, for example, a die coater 124 and a backup roller 126 disposed to face the die coater 124 are provided. The surface opposite to the surface on which the coating film 30M of the first film 10 is formed is wound around the backup roller 126, and the surface of the first film 10 continuously transported is coated with the coating solution from the discharging port of the die coater 124, to form the coating film 30M. Here, the coating film 30M is a quantum dot-containing composition before curing with which the first film 10 is coated.

According to the present embodiment, the die coater 124 to which the extrusion coating method is applied is provided as the coating device in the coating unit 120, but the present invention is not limited thereto. For example, the coating device to which various methods such as a curtain coating method, a rod coating method, and a roll coating method are applied, can be used.

The first film 10 that passes through the coating unit 120 and on which the coating film 30M is formed is continuously transported to the laminating unit 130. In the laminating unit 130, the second film 20 continuously transported is laminated on the coating film 30M, the coating film 30M is held between the first film 10 and the second film 20.

The laminate roller 132 and a heating chamber 134 that surrounds the laminate roller 132 are provided on the laminating unit 130. An opening portion 136 through which the first film 10 passes and an opening portion 138 through which the second film 20 passes are provided in the heating chamber 134.

A backup roller 162 is disposed at a position that faces a laminate roller 132. With respect to the first film 10 on which the coating film 30M is formed, a surface opposite to the surface on which the coating film 30M is formed is wound around the backup roller 162 and continuously transported to a laminate position P. The laminate position P means a position at which the contact between the second film 20 and the coating film 30M starts. The first film 10 is preferably wound around the backup roller 162 before reaching the laminate position P. Even in a case where wrinkles are generated in the first film 10, wrinkles are straightened and removed until reaching the laminate position P due to the backup roller 162. Accordingly, it is preferable that a distance L1 from a position (contact position) at which the first film 10 is wound around the backup roller 162 to the laminate position P is long, for example, the distance L1 is preferably 30 mm or greater and the upper limit value thereof is generally determined by a diameter of the backup roller 162 and a path line.

According to the present embodiment, lamination of the second film 20 is performed by the backup roller 162 used in the curing unit 160 and the laminate roller 132. That is, the backup roller 162 used in the curing unit 160 is also used as a roller used in the laminating unit 130. However, the present invention is not limited to the embodiment, and independently from the backup roller 162, a roller for lamination is provided in the laminating unit 130 such that double use of the backup roller 162 is not performed.

The number of rollers can be reduced by using the backup roller 162 used in the curing unit 160 in the laminating unit 130. The backup roller 162 can be used as a heating roller to the first film 10.

The second film 20 sent from the sending machine (not illustrated) is wound around the laminate roller 132 and is continuously transported through a portion between the laminate roller 132 and the backup roller 162. The second film 20 is laminated on the coating film 30M formed on the first film 10 at the laminate position P. Accordingly, the coating film 30M is held between the first film 10 and the second film 20. The laminate is obtained by overlapping the second film 20 on the coating film 30M and perform lamination.

A distance L2 between the laminate roller 132 and the backup roller 162 is preferably equal to or greater than a total thickness value of the first film 10, the wavelength conversion layer (cured layer) 30 obtained by polymerizing and curing the coating film 30M, and the second film 20. L2 is preferably equal to or less than a length obtained by adding 5 mm to the total thickness of the first film 10, the coating film 30M, and the second film 20. In a case where the distance L2 is equal to or less than a length obtained by adding 5 mm to the total thickness, it is possible to prevent the intrusion of bubbles between the second film 20 and the coating film 30M. Here, the distance L2 between the laminate roller 132 and the backup roller 162 is the shortest distance between an outer peripheral surface of the laminate roller 132 and an outer peripheral surface of the backup roller 162.

The rotation accuracy of the laminate roller 132 and the backup roller 162 is 0.05 mm or less and preferably 0.01 mm or less by radial runout. As the radial runout is smaller, the thickness distribution of the coating film 30M can be reduced.

In order to suppress thermal deformation after holding the coating film 30M between the first film 10 and the second film 20, a difference between the temperature of the backup roller 162 of the curing unit 160 and the temperature of the first film 10 and a difference between the temperature of the backup roller 162 and the temperature of the second film 20 is preferably 30° C. or less, more preferably 15° C. or less, and most preferably 0° C. (that is, the temperatures of the films and the backup roller are the same).

In order to reduce the difference with the temperature of the backup roller 162, in a case where the heating chamber 134 is provided, it is preferable to heat the first film 10 and the second film 20 in the heating chamber 134. For example, the first film 10 and the second film 20 can be heated by supplying hot air by a hot air generator (not illustrated) to the heating chamber 134.

Since the first film 10 can be wound around the backup roller 162 of which the temperature is adjusted, the first film 10 may be heated by the backup roller 162.

Meanwhile, with respect to the second film 20, in a case where the laminate roller 132 is caused to be a heating roller, the second film 20 can be heated by the laminate roller 132. Here, the heating chamber 134 and the heating roller are not indispensable, and can be provided, if necessary.

Subsequently, the coating film 30M is held between the first film 10 and the second film 20 and those are continuously transported to the curing unit 160. In the aspect illustrated in the drawings, the curing in the curing unit 160 is performed by light irradiation, but in a case where the polymerizable compound included in the quantum dot-containing composition is polymerized by heating, curing can be performed by heating of blowing of hot air or the like.

At positions facing the backup roller 162, light irradiation devices 164 are provided. The first film 10 and the second film 20 that hold the coating film 30M therebetween are continuously transported to a portion between the backup roller 162 and the light irradiation devices 164. The light irradiated by the light irradiation device may be determined according to the kinds of photopolymerizable compounds included in the quantum dot-containing composition, and examples thereof include ultraviolet rays. Here, the ultraviolet rays refer to light having a wavelength of 280 to 400 nm. As the light source that generates ultraviolet rays, a low pressure mercury lamp, a medium pressure mercury lamp, a high pressure mercury lamp, an extra high pressure mercury lamp, a carbon arc lamp, a metal halide lamp, and a xenon lamp can be used. The amount of the light irradiation may be set in the range obtained by in a range in which the polymerization curing of the coating film can proceed, and for example, the coating film 30M can be irradiated with the ultraviolet rays in the irradiation amount of 100 to 10,000 mJ/cm$^2$, as an example.

In the curing unit 160, in a state in which the coating film 30M is held between the first film 10 and the second film 20, the first film 10 is wound around the backup roller 162 and continuously transported, light irradiation is performed from the light irradiation devices 164, and the coating film 30M is cured, so as to form the wavelength conversion layer 30.

According to this embodiment, the first film 10 side is wound around the backup roller 162 and continuously transported, but the second film 20 may be wound around the backup roller 162 and continuously transported.

The expression of "wound around the backup roller 162" means a state in which any one of the first film 10 and the second film 20 is in contact with the surface of the backup roller 162 in a certain wrap angle. Accordingly, in a case of being continuously transported, the first film 10 and the second film 20 are synchronized with the rotation of the backup roller 162 and moved. The winding of the backup roller 162 may be performed on any region which is irradiated with at least ultraviolet rays.

The backup roller 162 includes a main body having a cylindrical shape and rotating shafts disposed at both end portions of the main body. The main body of the backup roller 162 has a diameter of φ 200 to 1,000 mm. The diameter φ of the backup roller 162 is not limited. Considering curl deformation of the laminated film, equipment cost, and rotation accuracy, the diameter is preferably φ 300 to 500 mm. The temperature of the backup roller 162 can be adjusted by installing a temperature controller to the main body of the backup roller 162.

The temperature of the backup roller 162 can be determined by considering the heat generation during light irradiation, the curing efficiency of the coating film 30M, and the occurrence of wrinkle deformation of the first film 10 and the second film 20 on the backup roller 162. The backup roller 162 is preferably set in the temperature range of 10° C. to 95° C. and more preferably set in the temperature range of 15° C. to 85° C. Here, the term "temperature" with respect to the roller refers to the surface temperature of the roller.

A distance L3 between the laminate position P and the light irradiation devices 164 can be set, for example, as 30 mm or greater.

The coating film 30M is cured by light irradiation to be the wavelength conversion layer 30, and the wavelength conversion member 1D including the first film 10, the wavelength conversion layer 30, and the second film 20 is manufactured. The wavelength conversion member 1D is wound around a peeling roller 180 and peeled off from the backup roller 162. The wavelength conversion member 1D is continuously transported to the winding machine (not illustrated) and subsequently the wavelength conversion member 1D is wound in a roll shape by the winding machine.

[Backlight Unit]

Figure 4:
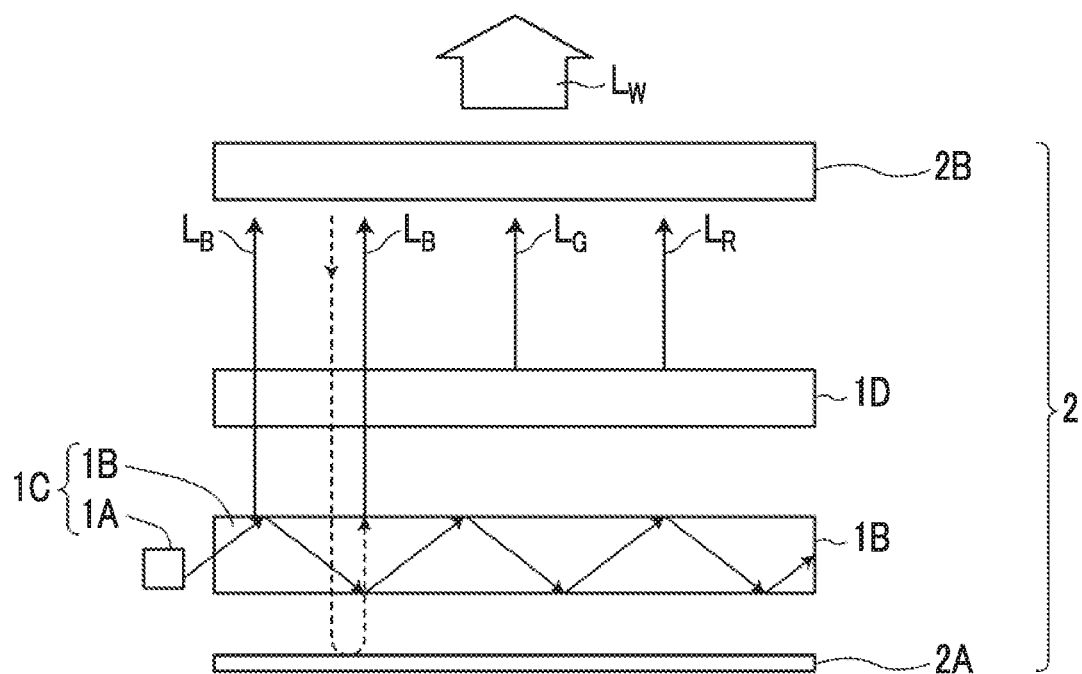
FIG. 4 is a schematic structural cross-sectional view illustrating a backlight unit including the wavelength conversion member according to the embodiment of the present invention.

Subsequently, an example of a backlight unit including the wavelength conversion member according to the present disclosure is described. FIG. 4 is a schematic structural cross-sectional view illustrating the backlight unit.

As illustrated in FIG. 4, a backlight unit 2 according to the present disclosure includes a surface light source 1C formed of a light source 1A that emits primary light (the blue light $L_B$) and a light guide plate 1B that guides and emits the primary light emitted from the light source 1A, the wavelength conversion member 1D included on the surface light source 1C, a retroreflecting member 2B disposed to face the surface light source 1C with the wavelength conversion member 1D interposed therebetween, and a reflecting plate 2A disposed to face the wavelength conversion member 1D with the surface light source 1C interposed therebetween. The wavelength conversion member 1D emits fluorescence by using at least a portion of the primary light $L_B$ emitted from the surface light source 1C as excitation light and emits secondary light (the green light $L_G$ and the red light $L_R$) formed of this fluorescence and the primary light $L_B$ that pass through the wavelength conversion member 1D. White light $L_W$ is emitted from the surface of the retroreflecting member 2B due to $L_G$, $L_R$, and $L_B$.

The shape of the wavelength conversion member 1D is not particularly limited and may be an arbitrary shape such as a sheet shape or a bar shape.

In FIG. 4, $L_B$, $L_G$, and $L_R$ emitted from the wavelength conversion member 1D are incident to the retroreflecting member 2B, and each of the incident light repeats the reflection between the retroreflecting member 2B and the reflecting plate 2A and passes through the wavelength conversion member 1D many times. As a result, in the wavelength conversion member 1D, the excitation light (the blue light $L_B$) in a sufficient amount is absorbed by the quantum dots that emit the red light $L_R$ (for example, quantum dots 30A in FIG. 1) and the quantum dots 30B that emit the green light $L_G$, (for example, quantum dots 30B in FIG. 1), the fluorescence (the green light $L_G$ and the red light $L_R$) in a necessary amount is emitted, and the white light $L_W$ as the sum total of those is emitted from the retroreflecting member 2B.

In a case where the ultraviolet light is used as the excitation light, the white light can be generated by combining red light emitted by the quantum dots 30A, green light emitted by the quantum dots 30B, and blue light emitted by the quantum dots 30C, by causing the ultraviolet light to serve as excitation light and to be incident to the wavelength conversion layer 30 including the quantum dots 30A, 30B, and 30C (not illustrated) in FIG. 1.

In view of achieving high brightness and high color reproducibility, it is preferable to use a backlight unit that has been converted into a multi-wavelength light source. For example, it is preferable to emit blue light having an emission center wavelength in a wavelength range of 430 to 480 nm and having a peak of emission intensity in which the half-width is 100 nm or less, green light having an emission center wavelength in a wavelength range of 520 to 560 nm and having a peak of emission intensity in which the half-width is 100 nm or less, and red light having an emission center wavelength in a wavelength range of 600 to 680 nm and having a peak of emission intensity in which the half-width is 100 nm or less.

In view of further improvement of brightness and color reproducibility, the wavelength range of the blue light emitted by the backlight unit is more preferably 440 to 460 nm.

In the same point of view, the wavelength range of the green light emitted by the backlight unit is more preferably 520 to 545 nm.

In the same point of view, the wavelength range of the red light emitted by the backlight unit is more preferably 610 to 640 nm.

In the same point of view, the half-width of each of the emission intensity of the blue light, the green light and the red light that are emitted by backlight unit is preferably 80 nm or less, more preferably 50 nm or less, even more preferably 40 nm or less, and still even more preferably 30 nm or less. Among these, the half-width of the emission intensity of blue light is particularly preferably 25 nm or less.

Examples of the light source 1A include a light source that emits blue light having an emission center wavelength in a wavelength range of 430 nm to 480 nm or a light source that emits ultraviolet light. As the light source 1A, a light emitting diode, a laser light source, and the like can be used.

As illustrated in FIG. 4, the surface light source 1C may be a light source formed of the light source 1A and the light guide plate 1B that guides and emits the primary light emitted from the light source 1A and may be a light source in which the light source 1A is disposed in a planar shape parallel to the wavelength conversion member 1D and a diffusion plate instead of the light guide plate 1B. The former light source is generally called an edge light mode and the latter light source is called a direct backlight mode.

In FIG. 4, as the configuration of the backlight unit, an edge light mode using the light guide plate, the reflecting plate, or the like as configuration members is described, but the backlight unit may be the direct back light mode. As the light guide plate, well-known light guide plates may be used without limitation.

According to the present embodiment, a case where the surface light source is used as the light source is described, but a light source other than the surface light source can be used as the light source.

In a case where the light source that emits blue light is used, in the wavelength conversion layer, the quantum dots 30A that are excited by at least excitation light and emit red light and the quantum dots 30B that emit green light are preferably included. Accordingly, the white light can be generated by combining blue light that is emitted from the light source and that passes through the wavelength conversion member and red light and green light that are emitted from the wavelength conversion member.

According to another aspect, as the light source, a light source (ultraviolet light source) that emits ultraviolet light having an emission center wavelength in the wavelength range of 300 nm to 430 nm, for example, an ultraviolet light emitting diode can be used.

According to another aspect, a laser light source can be used instead of the light emitting diode.

The reflecting plate 2A is not particularly limited, and well-known plates can be used. The reflecting plates employable as the reflecting plate 2A are disclosed in JP3416302B, JP3363565B, JP4091978B, and JP3448626B, and the contents thereof are incorporated in the present application by reference.

The retroreflecting member 2B may include well-known diffusion plates, diffusion sheets, prism sheets (for example, BEF series manufactured by Sumimoto 3M Limited), or reflective type polarizing film (for example, DBEF series manufactured by Sumimoto 3M Limited). The configuration of the retroreflecting member 2B is disclosed in JP3416302B, JP3363565B, JP4091978B, and JP3448626B, and the contents thereof are incorporated in the present application by reference.

[Liquid Crystal Display Device]

Figure 5:
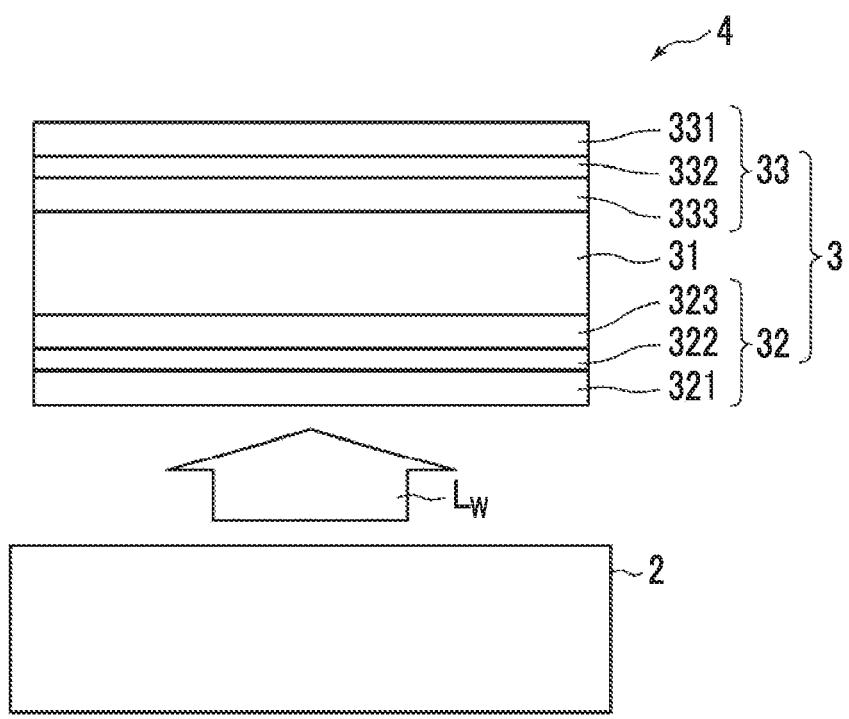
FIG. 5 is a schematic structural cross-sectional view of a liquid crystal display device including the backlight unit according to the embodiment of the present invention.

The backlight unit 2 described above can be applied to the liquid crystal display device. FIG. 5 is a schematic structural cross-sectional view of an example of the liquid crystal display device according to the present disclosure.

As illustrated in FIG. 5, a liquid crystal display device 4 includes the backlight unit 2 according to the above embodiment (FIG. 4) and a liquid crystal cell unit 3 disposed to face the retroreflecting member 2B side of the backlight unit 2. The liquid crystal cell unit 3 has a configuration of holding a liquid crystal cell 31 between polarizing plates 32 and 33, and the polarizing plates 32 and 33 have a configuration of protecting both main surfaces of polarizers 322 and 332 to be protected by polarizing plate protective films 321, 323, 331, and 333.

The liquid crystal cell 31 and the polarizing plates 32 and 33 included in the liquid crystal display device 4 and the components are not particularly limited. Those produced in the well-known methods or commercially available products may be used without limitation. It is possible to provide a well-known interlayer such as an adhesive layer between respective layers.

The driving mode of the liquid crystal cell 31 is not particularly limited, and various modes such as twisted nematic (TN), super twisted nematic (STN), vertical alignment (VA), in-plane switching (IPS), and optically compensated bend (OCB) cell may be used. The driving mode of the liquid crystal cell is preferably a VA mode, an OCB mode, an IPS mode, or a TN mode, although the present disclosure is not limited thereto. The configuration of the liquid crystal display device in the VA mode includes a configuration illustrated in FIG. 2 of JP2008-262161A. Here, the specific configuration of the liquid crystal display device is not particularly limited, and well-known configurations can be employed.

The liquid crystal display device 4 may further include an optical compensating member that performs optical compensation, an accompanying functional layer such as an adhesive layer, and the like, as necessary. A surface layer such as a forward scattering layer, a primer layer, an antistatic layer, or an undercoat layer may be disposed together with or instead of a color filter substrate, a thin layer transistor substrate, a lens film, a diffusion sheet, a hard coat layer, an antireflection layer, a low reflection layer, an anti-glare layer, and the like.

The polarizing plate 32 on the backlight side may have a retardation film as the polarizing plate protective film 323 on the liquid crystal cell 31 side. As the retardation film, a well-known cellulose acylate film and the like can be used.

The backlight unit 2 and the liquid crystal display device 4 include wavelength conversion layers obtained by using the quantum-dot composition having a high polymerization reaction rate and satisfactory curing properties according to the present disclosure, and thus a backlight unit and a liquid crystal display device with high brightness can be obtained.

EXAMPLES

Hereinafter, the present disclosure will be further specifically described with reference to Examples. Materials, used amounts, ratios, treatment details, and treatment procedures provided in the following examples can be suitably changed without departing from the gist of the present disclosure. Accordingly, the scope of the present disclosure may not be construed to be limited to the specific examples provided below.

(Production of Barrier Film A)

An organic layer and an inorganic layer were sequentially formed on one side of a support by the following order procedures by using a polyethylene terephthalate (PET) film (manufactured by Toyobo Co., Ltd., product name "COSMOSHINE (registered trademark) A4300", thickness: 50 µm) as the support.

(Forming of Organic Layer)

Trimethylolpropane triacrylate (product name "TMPTA", manufactured by Daicel-Allnex Ltd.) and a photopolymerization initiator (product name "ESACURE (registered trademark) KTO46", manufactured by Lamberti S.p.A.) were prepared and weighed to have a mass ratio of 95:5, and these were dissolved in methyl ethyl ketone to obtain a coating solution having a solid content concentration of 15%. A PET film was coated with this coating solution by roll to roll using a die coater and was passed through a drying zone at 50° C. for 3 minutes. Thereafter, irradiation with ultraviolet rays was performed under an atmosphere of nitrogen (integrating accumulate irradiation amount: about 600 mJ/cm$^2$), curing with ultraviolet rays was performed, and the organic layer was wound up. The thickness of the organic layer formed on the support was 1 µm.

(Forming of Inorganic Layer)

Subsequently, an inorganic layer (silicon nitride layer) was formed on the surface of the organic layer by using a roll-to-roll CVD apparatus. Silane gas (flow rate: 160 sccm), ammonia gas (flow rate: 370 sccm), hydrogen gas (flow rate: 590 sccm), and nitrogen gas (flow rate: 240 sccm) were used as raw material gas. As a power source, a high-frequency power source with a frequency of 13.56 MHz was used. The film forming pressure was 40 Pa, and the film thickness reached was 50 nm. In this manner, a barrier film in which the inorganic layer was laminated on the surface of the organic layer formed on the support was produced.

A second organic layer was laminated on the surface of the inorganic layer. In order to add the second organic layer, 5.0 parts by mass of a photopolymerization initiator (product name "IRGACURE 184", manufactured by BASF SE) was weighed to 95.0 parts by mass of a urethane skeleton acrylate polymer (product name "ACRIT 8BR930", manufactured by Taisei Fine Chemical Co. Ltd.) and was dissolved in methyl ethyl ketone to prepare a coating solution having a solid content concentration of 15%.

This coating solution was directly applied to the surface of the inorganic layer by roll-to-roll using a die coater and passed through a drying zone at 100° C. for 3 minutes. Thereafter, the coating solution was cured by irradiation with ultraviolet rays (integrating accumulate irradiation amount of about 600 mJ/cm$^2$) by being held by a heat roll heated to 60° C. and was wound up. The thickness of the second organic layer formed on the support was 1 µm. As such, a barrier film with the second organic layer (hereinafter, barrier film A) was produced.

(Production of Barrier Film B)

—Preparation of Polymerizable Composition for Forming Light Scattering Layer—

As light scattering particles, 150 g of silicone resin particles (product name "TOSPEARL 120", manufactured by Momentive Performance Materials Inc., average particle size of 2.0 μm) and 40 g of polymethyl methacrylate (PMMA) particles (Techpolymer manufactured by Sekisui Chemical Co., Ltd., average particle size 8 μm) was first stirred with 550 g of methyl isobutyl ketone (MIBK) for about one hour and dispersed to obtain a dispersion liquid. 50 g of an acrylate-based compound (VISCOAT 700HV manufactured by Osaka Organic Chemical Industry Ltd.) and 40 g of an acrylate-based compound (product name "8BR500", manufactured by Taisei Fine Chemical Co., Ltd.) were added to the obtained dispersion liquid and further stirred. 1.5 g of a photopolymerization initiator (product name "IRGACURE (registered trademark) 819", manufactured by BASF SE) and 0.5 g of a fluorine-based surfactant (product name "FC4430", manufactured by 3M) were further added to produce a coating solution (A polymerizable composition for forming a light scattering layer).

—Application and Curing of Polymerizable Composition for Forming Light Scattering Layer—

The coating solution was applied by a die coater such that the surface of the PET film of the barrier film A was the coated surface. The wet coating amount was adjusted with a liquid feed pump and the coating was performed at a coating amount of 25 cc/m$^2$ (the thickness was adjusted so as to be about 12 μm in the dry film). The film passed through a drying zone at 60° C. for three minutes, was wound around a backup roller adjusted at 30° C., cured with ultraviolet rays of 600 mJ/cm$^2$, and was wound up. As such, the barrier film B in which the light scattering layer was laminated was obtained.

(Production of Barrier Film C)

—Preparation of Polymerizable Composition for Forming Mat Layer—

190 g of silicone resin particles (product name: "TOSPEARL 2000b", manufactured by Momentive Performance Materials Inc., average particle size 6.0 μm) were first stirred with 4,700 g of methyl ethyl ketone (MEK) for about one hour as particles to form unevenness of the mat layer and dispersed so as to obtain a dispersion liquid. 430 g of an acrylate-based compound (product name "A-DPH" Shin-Nakamura Chemical Co., Ltd.) and 800 g of an acrylate-based compound (product name "8BR930", manufactured by Taisei Fine Chemical Co., Ltd.) were added to the obtained dispersion liquid and further stirred. 40 g of a photopolymerization initiator (product name "IRGACURE (registered trademark) 184", manufactured by BASF SE) was added so as to produce a coating solution.

—Application and Curing of Polymerizable Composition for Forming Mat Layer—

The coating solution was applied by a die coater such that the surface of the PET film of the barrier film A was the coated surface. The wet coating amount was adjusted with a liquid feed pump and the coating was performed at a coating amount of 10 cc/m$^2$. The film passed through a drying zone at 80° C. for three minutes, was wound around a backup roller adjusted at 30° C., cured with ultraviolet rays of 600 mJ/cm$^2$, and was wound up. The thickness of the mat layer formed after curing was about 3 to 6 μm, and the mat layer had surface roughness in which the maximum section height Rt (measured based on JIS B0601) was 1 to 3 μm. Accordingly, a barrier film C in which an irregular layer was laminated was obtained.

(Preparation of Quantum Dot-Containing Composition and Production of Coating Solution Used in Example 1)

In Example 1, CZ520-100 (product name) (emission wavelength of 535 nm, hereinafter, quantum dot dispersion liquid 1) manufactured by NN-Labs, LLC and CZ620-100 (product name) (emission wavelength of 630 nm, hereinafter, quantum dot dispersion liquid 2) manufactured by NN-Labs, LLC were used as the toluene dispersion liquid of green quantum dots and the toluene dispersion liquid of red quantum dots. All of these were quantum dots using CdSe as a core, ZnS as a shell, and octadecylamine as a ligand and were dispersed in toluene at a concentration of 3 weight %.

20 parts by mass of the quantum dot dispersion liquid 1 and 2 parts by mass of quantum dot dispersion liquid 2 were mixed and depressurized at 40° C. and 0.03 atm for 15 minutes to remove toluene. Thereafter, a polymerizable compound (lauryl methacrylate), a ligand (LG 5), and a polymerization initiator (Irgacure TPO) were prepared under a nitrogen atmosphere such that the resulting coating solution has the composition ratio of the quantum dot-containing composition 1. The coating solution was used after filtered with a polypropylene filter of 0.2 μm.

| -Quantum dot-containing composition 1- | |
|---|---|
| Quantum dot dispersion liquid 1 (emission maximum: 535 nm) of quantum dots 1 | 20 parts by mass |
| Quantum dot dispersion liquid 2 (emission maximum: 630 nm) of quantum dots 2 | 2 parts by mass |
| Lauryl methacrylate (product name "LIGHT ESTER L", manufactured by Kyoeisha Chemical Co., Ltd.) | 92.1 parts by mass |
| Ligand LG5 (shown in Table 1) | 7 parts by mass |
| Polymerization initiator (Irgacure TPO (product name), manufactured by BASF SE) | 0.2 parts by mass |

Tables 1 and 2 present ligands used in Examples and Comparative Examples.

TABLE 1

Ligand

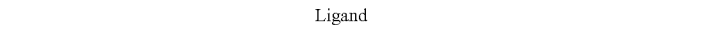

Example LG1

TABLE 1-continued

Ligand

LG2

LG3

LG4

TABLE 1-continued
| Ligand |
|---|
| Example LG5 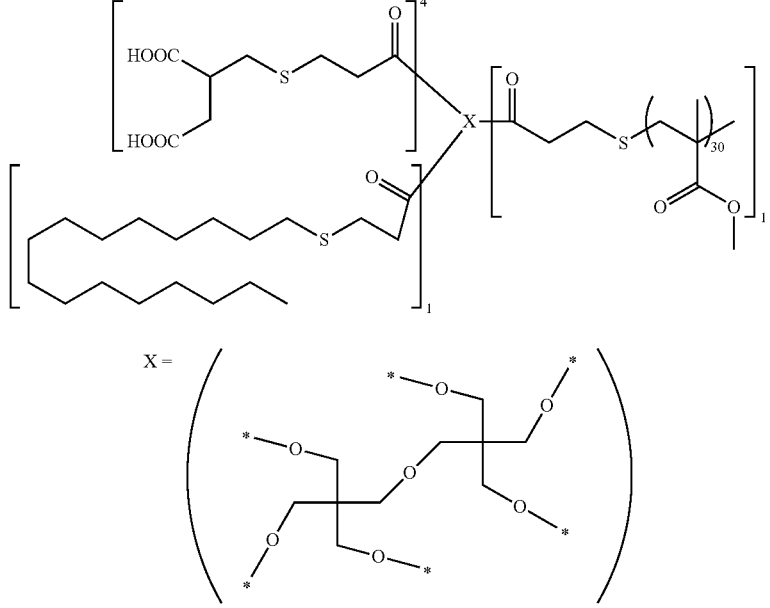 |
| LG6 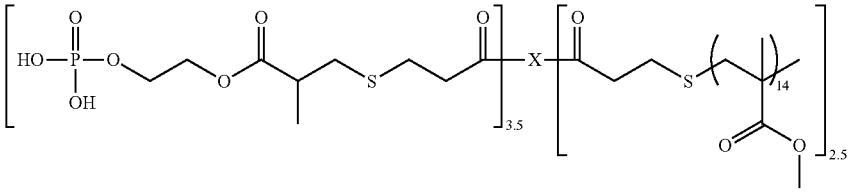 |
| Example LG7 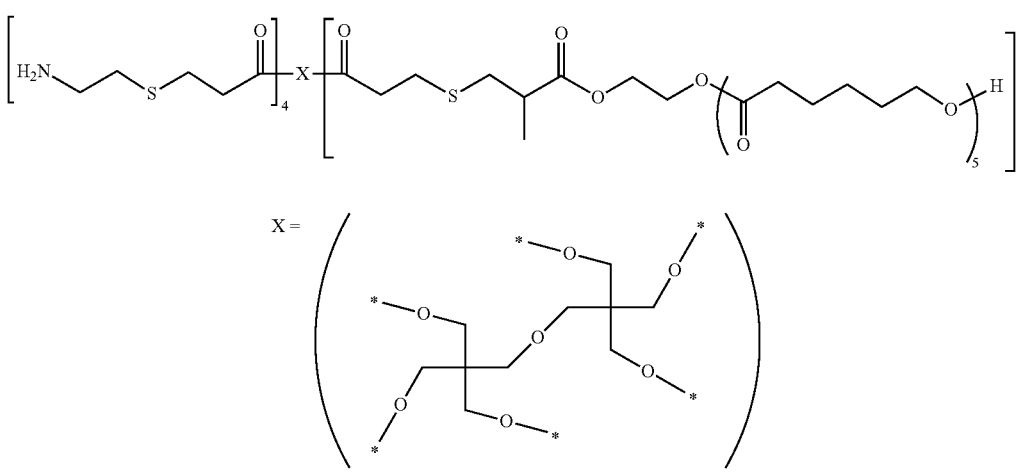 |

TABLE 1-continued

| Ligand |
|---|
| LG8 — chemical structure |
| LG9 — chemical structure |
| LG10 — chemical structure |

TABLE 2
| | | |
|---|---|---|
| Comparative Example | C-1 | 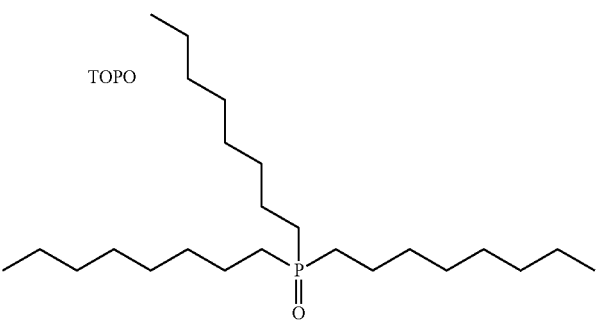  TOPO |
| Comparative Example | C-2 | 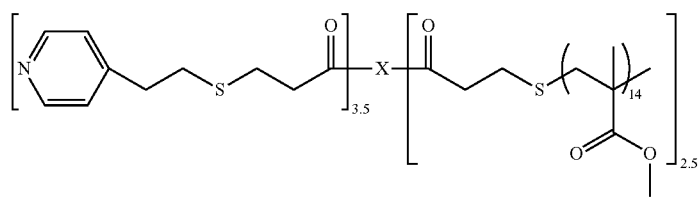 |
| | | 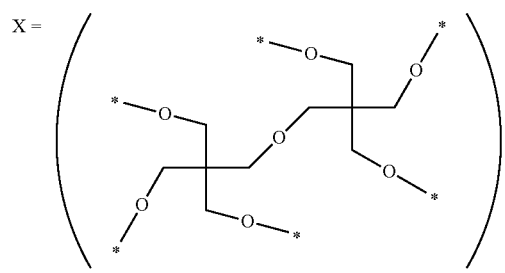 |
| Comparative Example | C-3 | 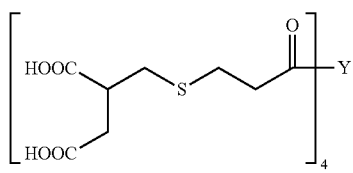 |
| | | 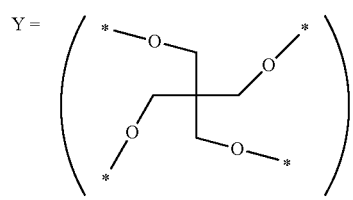 |
| Comparative Example | C-4 | 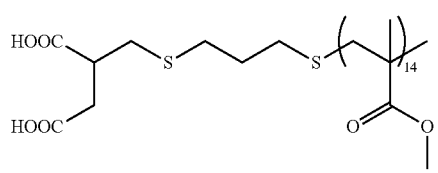 |
| Comparative Example | C-5 | 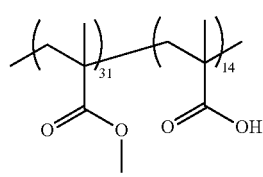 |

(Preparation of Quantum Dot-Containing Compositions and Production of Coating Solution Used in Examples 2 to 6)

The production was carried out in the same manner as in Example 1 except that the amounts of the quantum dot dispersion liquids and the types and amounts of the polymerizable compound and the ligand were changed as shown in Table 3.

However, the polymerizable compound DCP shown in Table 3 is dicyclopentanyl acrylate (product name "FA-513 AS", manufactured by Hitachi Chemical Co., Ltd.), A-DCP is tricyclodecanedimethanol diacrylate (product name "A-DCP", manufactured by Shin-Nakamura Chemical Co., Ltd.).

(Preparation of Quantum Dot-Containing Composition and Production of Coating Solution Used in Example 7)

In Example 7, INP530-25 (product name) (emission wavelength of 530 nm, quantum dot dispersion liquid 3) manufactured by NN-Labs, LLC and INP620-25 (product name) (emission wavelength of 620 nm, quantum dot dispersion liquid 4 having an) manufactured by NN-Labs, LLC were used as the toluene dispersion liquid of green quantum dots and the toluene dispersion liquid of red quantum dots. All of these were quantum dots using InP as a core, ZnS as a shell, and octadecylamine as a ligand and were dispersed in toluene at a concentration of 3 weight %.

A coating solution used in Example 7 was produced in the same manner as in Example 2 except that the quantum dot dispersion liquid was changed to the quantum dot dispersion liquid 3 and the quantum dot dispersion liquid 4.

(Preparation of Quantum Dot-Containing Compositions and Production of Coating Solutions Used in Comparative Examples 1 to 7)

The production was carried out in the same manner as in Example 1 except that the types and amounts of the quantum dot dispersion liquid, the polymerizable compound, the ligand, the polymerization initiator were changed as shown in Table 3.

(Production of Wavelength Conversion Member of Example 1)

The barrier film B produced in the procedure described above was used as the first film, and the barrier film C was used as the second film, and a wavelength conversion member was obtained in the manufacturing step described with reference to FIGS. 2 and 3. Specifically, the barrier film B was prepared as the first film and was continuously transported in the tension of 1 m/min and 60 N/m such that the surface side of the inorganic layer was coated with the quantum dot-containing composition 1 with a die coater, so as to form a coating film having a thickness of 50 μm. Subsequently, the first film on which a coating film was formed was wound around the backup roller, the second film was laminated on the coating film in a direction in which the inorganic layer side was in contact with the coating film, and the coating film was cured by being irradiated with ultraviolet rays by using an air-cooled metal halide lamp (manufactured by Eye Graphics Co., Ltd.) of 160 W/cm while being continuously transported in a state in which the coating film was held between the barrier film B and the barrier film C, so as to form the wavelength conversion layer containing quantum dots. The irradiation amount of the ultraviolet rays was 2,000 mJ/cm$^2$. L1 in FIG. 3 was 50 mm, L2 was 1 mm, and L3 was 50 mm.

(Production of Wavelength Conversion Members Used in Other Examples and Comparative Examples)

Wavelength conversion members were produced in the same manner as in Example 1 except for using the coating solutions presented in Table 3 and changing the film thickness formed therefrom.

(Measurement of Brightness)

A commercially available tablet terminal equipped with a blue light source in the backlight unit (product name "Kindle (registered trademark) Fire HDX 7", manufactured by Amazon.com, Inc., hereinafter simply referred to as Kindle Fire HDX 7) was disassembled, and a backlight unit was removed. The wavelength conversion members of examples or comparative examples which were cut into a rectangle shape were incorporated instead of a quantum dot enhancement film (QDEF) which is a wavelength conversion film incorporated to the backlight unit. In this manner, the liquid crystal display device was produced. The produced liquid crystal display device was turned on, the entire surface was caused to display a white background, and the brightness was measured by using a brightness meter (product name "SR3", manufactured by TOPCON Technohouse Corporation) provided at a position of 520 mm in the vertical direction to the surface of the light guide plate. The brightness Y was evaluated based on the following evaluation standards. The measuring results are presented in Table 3.

(Evaluation of Heat Resistance)

The created wavelength conversion member was heated at 85° C. for 1,000 hours by using a precision thermostat DF411 manufactured by Yamato Scientific Co., Ltd. Thereafter, the brightness was measured by incorporating the wavelength conversion member to Kindle Fire HDX 7.

The heat resistance was evaluated based on the evaluation standard. The measuring results are presented in Table 3.

<Evaluation Standard>

AA: Decrease in brightness by the heating was less than 5%

A: Decrease in brightness by the heating was 5% to less than 15%

B: Decrease in brightness by the heating was 15% to less than 30%

C: Decrease in brightness by the heating was 30% to less than 50%

D: Decrease in brightness by the heating was 50% or greater

TABLE 3

| | Substrate film | Film thickness of wavelength conversion layer (μm) | Toluene dispersion of green quantum dot | | Toluene dispersion of red quantum dot | | Polymerizable composition (1) | |
|---|---|---|---|---|---|---|---|---|
| | | | Base material | Amount (mass by parts) | Base material | Amount (mass by parts) | Base material | Amount (mass by parts) |
| Example 1 | Barrier film B, C | 50 | Quantum dot dispersion 1 | 20 | Quantum dot dispersion 2 | 2 | LIGHT ESTER L | 92.1 |
| Example 2 | Barrier film B, C | 50 | Quantum dot dispersion 1 | 20 | Quantum dot dispersion 2 | 2 | DCP | 78.5 |

TABLE 3-continued

| | | | | | | | | |
|---|---|---|---|---|---|---|---|---|
| Example 3 | Barrier Film B, C | 25 | Quantum dot dispersion 1 | 40 | Quantum dot dispersion 2 | 4 | DCP | 77.6 |
| Example 4 | Barrier film B, C | 15 | Quantum dot dispersion 1 | 67 | Quantum dot dispersion 2 | 7 | DCP | 76.5 |
| Example 5 | Barrier film B, C | 50 | Quantum dot dispersion 1 | 20 | Quantum dot dispersion 2 | 2 | DCP | 78.5 |
| Example 6 | Barrier film B, C | 50 | Quantum dot dispersion 1 | 20 | Quantum dot dispersion 2 | 2 | DCP | 78.5 |
| Example 7 | Barrier Film B, C | 50 | Quantum dot dispersion 3 | 20 | Quantum dot dispersion 4 | 2 | DCP | 78.5 |
| Comparative Example 1 | Barrier film B, C | 50 | Quantum dot dispersion 1 | 20 | Quantum dot dispersion 2 | 2 | LIGHT ESTER L | 92.1 |
| Comparative Example 2 | Barrier film B, C | 25 | Quantum dot dispersion 1 | 40 | Quantum dot dispersion 2 | 4 | LIGHT ESTER L | 91.5 |
| Comparative Example 3 | Barrier film B, C | 15 | Quantum dot dispersion 1 | 67 | Quantum dot dispersion 2 | 7 | LIGHT ESTER L | 90.6 |
| Comparative Example 4 | Barrier film B, C | 50 | Quantum dot dispersion 1 | 20 | Quantum dot dispersion 2 | 2 | LIGHT ESTER L | 92.1 |
| Comparative Example 5 | Barrier film B, C | 50 | Quantum dot dispersion 1 | 20 | Quantum dot dispersion 2 | 2 | LIGHT ESTER L | 92.1 |
| Comparative Example 6 | Barrier film B, C | 50 | Quantum dot dispersion 1 | 20 | Quantum dot dispersion 2 | 2 | LIGHT ESTER L | 92.1 |
| Comparative Example 7 | Barrier film B, C | 50 | Quantum dot dispersion 1 | 20 | Quantum dot dispersion 2 | 2 | LIGHT ESTER L | 92.1 |

| | Polymerizable composition (2) | | Ligand | | Polymerization initiator | | | |
|---|---|---|---|---|---|---|---|---|
| | Base material | Amount (mass by parts) | Base material | Amount (mass by parts) | Base material | Amount (mass by parts) | Brightness (cd/m$^2$) | Heat Resistance |
| Example 1 | | | LG5 | 7.0 | IrgTPO | 0.2 | 524 | A |
| Example 2 | A-DCP | 19.6 | LG1 | 1.0 | IrgTPO | 0.2 | 518 | AA |
| Example 3 | A-DCP | 19.4 | LG1 | 1.5 | IrgTPO | 0.2 | 522 | AA |
| Example 4 | A-DCP | 19.1 | LG1 | 2.0 | IrgTPO | 0.2 | 528 | AA |
| Example 5 | A-DCP | 19.6 | LG5 | 1.0 | IrgTPO | 0.2 | 512 | AA |
| Example 6 | A-DCP | 19.6 | LG7 | 1.0 | IrgTPO | 0.2 | 498 | B |
| Example 7 | A-DCP | 19.6 | LG1 | 1.0 | IrgTPO | 0.2 | 461 | AA |
| Comparative Example 1 | | | C-1 | 7.0 | IrgTPO | 0.2 | 450 | D |
| Comparative Example 2 | | | C-1 | 7.0 | IrgTPO | 0.2 | 348 | D |
| Comparative Example 3 | | | C-1 | 7.0 | IrgTPO | 0.2 | 286 | D |
| Comparative Example 4 | | | C-2 | 7.0 | IrgTPO | 0.2 | 423 | C |
| Comparative Example 5 | | | C-3 | 7.0 | IrgTPO | 0.2 | 397 | C |
| Comparative Example 6 | | | C-4 | 7.0 | IrgTPO | 0.2 | 427 | C |
| Comparative Example 7 | | | C-5 | 7.0 | IrgTPO | 0.2 | 376 | C |

Hereinafter, details of Table 3 are provided.

LIGHT ESTER L: Lauryl methacrylate manufactured by Kyoeisha Chemical Co., Ltd.

DCP: Dicyclopentanyl acrylate manufactured by Hitachi Chemical Co., Ltd., product name "FA-513 AS"

A-DCP: Tricyclodecanedimethanol diacrylate manufactured by Shin-Nakamura Chemical Co., Ltd., product name "A-DCP"

IrgTPO: IrgacureTPO (Polymerization initiator, manufactured by BASF SE)

The structural formulas of LIGHT ESTER L, DCP, A-DCP and Irgacure TPO are shown below.

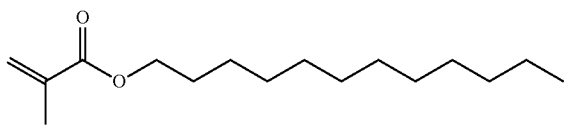

LIGHT ESTER L (Lauryl methacrylate)

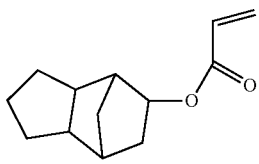

DCP (Dicyclopentanyl acrylate)

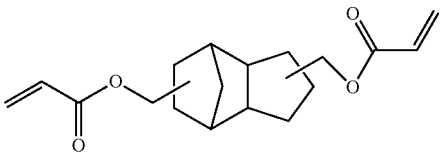

A-DCP (Tricyclodecanedimethanol diacrylate)

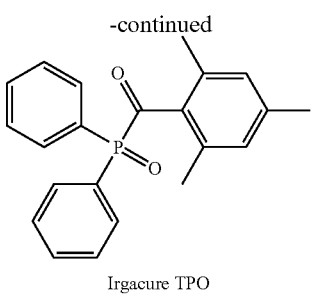

Irgacure TPO

As presented in Table 3, in display devices using the quantum dot-containing compositions according to the present disclosure, brightness of 460 cd/m² or greater were able to be obtained and the heat resistances thereof were also satisfactory. Meanwhile, in display devices of Comparative Examples 1 to 7 manufactured by using compositions including ligands different from the ligands according to the present disclosure, both the brightness and the heat resistance were all inferior to those of Examples.

The disclosure of Japanese Patent Application No. 2016-142729, filed Jul. 20, 2016, is incorporated herein by reference in its entirety. All documents, patent applications, and technical standards described in this specification are hereby incorporated by reference to the same extent as if each individual literature, patent application and technical standard were specifically and individually indicated as being incorporated by reference.

EXPLANATION OF REFERENCES

1A: light source
1B: light guide plate
1C: surface light source
1D: wavelength conversion member
2: backlight unit
2A: reflecting plate
2B: retroreflecting member
3: liquid crystal cell unit
4: liquid crystal display device
10, 20: barrier film
11, 21: support
12, 22: barrier layer
12a, 22a: organic layer
12b, 22b: inorganic layer
13: unevenness imparting layer (mat layer)
30: wavelength conversion layer
30A, 30B: quantum dot
30P: organic matrix
31: liquid crystal cell
$L_B$: excitation light (primary light, blue light)
$L_R$: red light (secondary light, fluorescence)
$L_G$: green light (secondary light, fluorescence)
$L_W$: white light

What is claimed is:

1. A quantum dot-containing composition comprising:
a quantum dot; and
a ligand having a coordinating group coordinated to a surface of the quantum dot,
wherein the ligand is represented by Formula III:

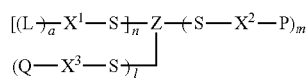

Formula III wherein, in Formula III, $X^2$ and $X^3$ are divalent organic linking groups, P is a polymer chain which has a degree of polymerization of 3 or greater and which includes at least one skeleton selected from a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polyether skeleton, or a polystyrene skeleton, Q is an alkyl group, an alkenyl group, or an alkynyl group each of which may have a substituent, L is a coordinating group; $X^1$ is an (a+1)-valent organic linking group; S is a sulfur atom; Z is an (n+m+l)-valent organic linking group; n and m are each independently a number of 1 or greater; l is a number of 0 or greater; n+m+l is an integer of 3 or greater; a units of L's may be identical to or different from each other; a is an integer from 1 to 2; in a case where a is 1, n is 2 or greater; and in a case where a is 2, n is 1 or greater.

2. The quantum dot-containing composition according to claim 1, further comprising a polymerizable compound.

3. The quantum dot-containing composition according to claim 1, further comprising:
at least one polymer; and
at least one solvent.

4. The quantum dot-containing composition according to claim 3, wherein the polymer is a water-soluble polymer.

5. The quantum dot-containing composition according to claim 4, wherein the water-soluble polymer is a polyvinyl alcohol or an ethylene-vinyl alcohol copolymer.

6. The quantum dot-containing composition according to claim 1, wherein the quantum dot is at least one kind selected from a quantum dot having an emission center wavelength in a wavelength range of 600 nm to 680 nm, a quantum dot having an emission center wavelength in a wavelength range of 520 nm to 560 nm, or a quantum dot having an emission center wavelength in a wavelength range of 430 nm to 480 nm.

7. A wavelength conversion member comprising a wavelength conversion layer obtained by curing the quantum dot-containing composition according to claim 1.

8. The wavelength conversion member according to claim 7, further comprising:
a barrier film having an oxygen permeability of 1.00 cm³/m²·day·atm or less,
wherein at least one of two main surfaces of the wavelength conversion layer is in contact with the barrier film.

9. The wavelength conversion member according to claim 8, wherein the wavelength conversion member includes two of the barrier film, and two main surfaces of the wavelength conversion layer are in contact with the barrier films, respectively.

10. A backlight unit comprising, at least:
the wavelength conversion member according to claim 7; and
a light source.

11. A liquid crystal display device comprising, at least:
the backlight unit according to claim 10; and
a liquid crystal cell.

* * * * *